US010796857B2

(12) United States Patent
Seo et al.

(10) Patent No.: US 10,796,857 B2
(45) Date of Patent: Oct. 6, 2020

(54) INORGANIC/ORGANIC HYBRID PEROVSKITE COMPOUND FILM, AND METHOD FOR MANUFACTURING SAME

(71) Applicants: KOREA RESEARCH INSTITUTE OF CHEMICAL TECHNOLOGY, Daejeon (KR); UNIST(ULSAN NATIONAL INSTITUTE OF SCIENCE AND TECHNOLOGY), Ulsan (KR)

(72) Inventors: Jang Won Seo, Seoul (KR); Jun Hong Noh, Daejeon (KR); Nam Joong Jeon, Gwangju (KR); Sang Il Seok, Daejeon (KR)

(73) Assignees: KOREA RESEARCH INSTITUTE OF CHEMICAL TECHNOLOGY, Daejeon (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 135 days.

(21) Appl. No.: 16/091,057

(22) PCT Filed: Apr. 5, 2017

(86) PCT No.: PCT/KR2017/003743
§ 371 (c)(1),
(2) Date: Oct. 3, 2018

(87) PCT Pub. No.: WO2017/176053
PCT Pub. Date: Oct. 12, 2017

(65) Prior Publication Data
US 2019/0122828 A1    Apr. 25, 2019

(30) Foreign Application Priority Data
Apr. 5, 2016 (KR) .................. 10-2016-0041763

(51) Int. Cl.
| | | |
|---|---|---|
| H01G 9/20 | (2006.01) | |
| C09D 4/00 | (2006.01) | |
| C09D 7/40 | (2018.01) | |
| C07F 7/24 | (2006.01) | |
| C09D 5/24 | (2006.01) | |
| H01L 51/00 | (2006.01) | |
| H01L 35/24 | (2006.01) | |
| H01L 51/05 | (2006.01) | |
| H01L 51/42 | (2006.01) | |
| H01L 51/50 | (2006.01) | |

(52) U.S. Cl.
CPC ............ *H01G 9/2009* (2013.01); *C07F 7/24* (2013.01); *C09D 4/00* (2013.01); *C09D 5/24* (2013.01); *C09D 7/40* (2018.01); *H01L 51/0077* (2013.01); *H01L 35/24* (2013.01); *H01L 51/0566* (2013.01); *H01L 51/0591* (2013.01); *H01L 51/4253* (2013.01); *H01L 51/5032* (2013.01)

(58) Field of Classification Search
CPC .......... H01G 9/2009; C09D 4/00; C09D 7/40; C09D 5/24; C07F 7/24; H01L 51/0077; H01L 51/0566; H01L 51/4253; H01L 51/5032; H01L 35/24
USPC ....................................................... 428/411.1
See application file for complete search history.

(56) References Cited

U.S. PATENT DOCUMENTS

| | | | | |
|---|---|---|---|---|
| 10,546,697 | B2 * | 1/2020 | Seok ................... | H01L 31/18 |
| 2015/0228415 | A1 * | 8/2015 | Seok ................... | H01G 9/2027 |
| | | | | 136/256 |
| 2018/0151813 | A1 * | 5/2018 | Zhu .................... | H01L 51/0077 |
| 2018/0330889 | A1 * | 11/2018 | Park ................... | H01L 51/0028 |

FOREIGN PATENT DOCUMENTS

| | | | | |
|---|---|---|---|---|
| EP | 3226317 | A1 | 10/2017 | |
| EP | 3355375 | A1 | 8/2018 | |
| JP | 2014049596 | A | 3/2014 | |
| KR | 20140035284 | A | 3/2014 | |
| KR | 20140035285 | A | 3/2014 | |
| KR | 20140035286 | A | 3/2014 | |
| KR | 20140091489 | A | 7/2014 | |
| WO | 2013171517 | A1 | 11/2013 | |
| WO | 2016021900 | A1 | 2/2016 | |
| WO | WO-2016021900 | A1 * | 2/2016 | ........... H01G 9/2009 |
| WO | 2016187340 | A1 | 11/2016 | |

OTHER PUBLICATIONS

Wang etal. "Transition from the Tetragonal to Cubic Phase of Organohalide Perovskite: The Role of Chlorine in Crystal Formation of CH3NH3PbI3 on TiO2 Substrates", ACS Publications; DOI: 10.1021 /acs.jpclett.5b01682 J. Phys. Chem. Lett. 2015, 6, 4379-4384. (Year: 2015).*
Strunks etal. "Formation of Thin Films of Organic-Inorganic Perovskites for High-Efficiency Solar Cells", Minireviews, Special Issue 150 Years of BASF DOI: 10.!002/anie.201410214. (Year: 2014).*
Zhao, Y. et al., "CH3NH3CI-Assisted One-Step Solution Growth of CH3NH3PbI3: Structure, Charge-Carrier Dynamics, and Photovoltaic Properties of Perovskite Solar Cells," The Journal of Physical Chemistry C, vol. 118, No. 18, Apr. 30, 2014, 8 pages.
Jeon, N. et al., "Solvent engineering for high-performance inorganic-organic hybrid perovskite solar cells," Nature Materials, vol. 13, No. 9, Sep. 2014, Available Online Jul. 6, 2014, 8 pages.
Xiao, M. et al., "A Fast Deposition-Crystallization Procedure for Highly Efficient Lead Iodide Perovskite Thin-Film Solar Cells," Angewandte Communications, vol. 126, No. 37, Sep. 8, 2014, Available Online Jul. 22, 2014, 6 pages.

(Continued)

*Primary Examiner* — Michael Bernshteyn
(74) *Attorney, Agent, or Firm* — McCoy Russell LLP

(57) ABSTRACT

The present invention relates to an inorganic/organic hybrid perovskite compound film. An inorganic/organic hybrid perovskite compound film according to the present invention is polycrystalline, and has a discontinuous (100) plane scattering intensity on a grazing incidence wide angle x-ray scattering (GIWAXS) spectrum obtained using an x-ray wavelength of 1.0688 Å.

13 Claims, 6 Drawing Sheets

(56) References Cited

OTHER PUBLICATIONS

Jung, J. et al., "Low-temperature processed high-performance flexible perovskite solar cells via rationally optimized solvent washing treatments," vol. 4, No. 108, Nov. 14, 2014, 8 pages.

Schlipf, J. et al., "A Closer Look into Two-Step Perovskite Conversion with X-ray Scattering," The Journal of Physical Chemistry Letters, vol. 6, No. 7, Mar. 19, 2015, 6 pages.

European Patent Office, Extended European Search Report Issued in Application No. 17779353.6, dated Nov. 15, 2019, Germany, 16 pages.

Shi, D. et al., "Low trap-state density and long carrier diffusion in organolead trihalide perovskite single crystals," Science Magazine, vol. 347, No. 6221, Jan. 30, 2015, 31 pages.

Dong, Q. et al., "Electron-hole diffusion lengths > 175 µm in solution-grown CH3NH3PbI3 single crystals," Science Magazine, vol. 347, No. 6225, Feb. 27, 2015, Published Online Jan. 29, 2015, 5 pages.

Stranks, S. et al., "Formation of Thin Films of Organic-Inorganic Perovskites for High-Efficiency Solar Cells," Angewandte Chemie International Edition in English, vol. 54, No. 11, Mar. 9, 2015, Published Online Feb. 6, 2015, 9 pages.

Huang, Y. et al., "Insight into Evolution, Processing and Performance of Multi-length-scale Structures in Planar Heterojunction Perovskite Solar Cells," Scientific Reports, vol. 5, Article No. 13657, Sep. 4, 2015, 11 pages.

Wang, Q. et al., "Transition from the Tetragonal to Cubic Phase of Organohalide Perovskite: The Role of Chlorine in Crystal Formation of CH3NH3PbI3 on TiO2 Substrates," The Journal of Physical Chemistry Letters, vol. 6, No. 21, Nov. 5, 2015, Published Online Sep. 29, 2015, 6 pages.

ISA Korean Intellectual Property Office, International Search Report Issued in Application No. PCT/KR2017/003743, dated Jul. 17, 2017, WIPO, 6 pages.

* cited by examiner

INORGANIC/ORGANIC HYBRID PEROVSKITE COMPOUND FILM, AND METHOD FOR MANUFACTURING SAME

CROSS-REFERENCE TO RELATED APPLICATIONS

The present application is a U.S. National Phase of International Patent Application Serial No. PCT/KR2017/003743 entitled "INORGANIC/ORGANIC HYBRID PEROVSKITE COMPOUND FILM, AND METHOD FOR MANUFACTURING SAME," filed on Apr. 5, 2017. International Patent Application Serial No. PCT/KR2017/003743 claims priority to Korean Patent Application No. 10-2016-0041763, filed on Apr. 5, 2016. The entire contents of each of the above-cited applications are hereby incorporated by reference in their entirety for all purposes.

TECHNICAL FIELD

The present invention relates to an inorganic/organic hybrid perovskite compound film and a method for preparing the same, and more particularly, to an inorganic/organic hybrid perovskite compound film having excellent crystallinity and orientation to show monocrystalline-like properties, and a method for preparing the same based on a solution coating method.

BACKGROUND ART

An inorganic/organic hybrid perovskite compound, also referred to as an organometal halide perovskite compound, is a material consisting of an organic cation (A), a metal cation (M) and a halogen anion (X), and having a perovskite structure. This inorganic/organic hybrid perovskite compound uses a very low-priced material, allows a low-priced solution process and a low temperature process by the characteristic of crystallization by self-assembling, and may be prepared by a low-priced raw material, thereby having excellent commerciality, and being actively studied in various fields such as a light emitting device, a memory device, a sensor and a photovoltaic device.

A perovskite solar cell refers to a solid solar cell of which the light absorbing material is based on the inorganic/organic hybrid perovskite compound (hereinafter, referred to as a perovskite compound). The present applicant has suggested a perovskite solar cell of a novel structure having significantly high generation efficiency, and has developed a perovskite solar cell having generation efficiency reaching 21%, in Korean Patent Laid-Open Publication No. 2014-0035284. By suggesting a perovskite solar cell of a novel structure, efficiency of a perovskite solar cell which was conventionally only about 10% was improved to reach 21%, however, in order to have efficiency of mid 20% which comes close to the efficiency of a crystalline silicon-based solar cell, the physical properties of the perovskite compound itself are needed to be improved together with this structure modification.

In order to further improve the generation efficiency of the perovskite solar cell, a decrease of photocharge by non-radiative recombination and scattering should be minimized. These non-radiative recombination and scattering occur mainly due to defects in a perovskite compound crystal, and a trap site of a grain boundary present in a perovskite compound film itself. Accordingly, in order to prevent extinction of a photocharge, crystallinity similar to a single crystal is required.

As is well known, it has been reported that when a perovskite compound including $CH_3NH_3PbI_3$ as a representative material is a single crystal, the compound has a hole diffusion length up to 175 μm, due to high charge carrier mobility, a long exciton life time and a low trap concentration (H. Jinsong et. al., Science 2015, 347, 967-970), and it has been also reported that a trap concentration of a perovskite compound of a single crystal is similar to a trap concentration of a high-purity silicon (O. M. Bakr et al. Science 2015, 347, 519). However, manufacturing devices of various structures using the perovskite compound of a single crystal itself is difficult to be implemented, and less commercial.

Accordingly, technology for preparing a perovskite compound film having high crystallinity, having an adjusted orientation to have a grain structure similar to a single crystal, and being formed of extremely coarse grains, using a solution process which is the biggest advantage of the perovskite compound may be core technology for maintaining commercial potential of a low-cost simple process and mass production, while dramatically improving the performance of perovskite compound-based devices including a solar cell.

DISCLOSURE

Technical Problem

An object of the present invention is to provide a perovskite compound film having a controlled orientation, and specifically, to provide a perovskite compound film having excellent crystallinity, being formed of extremely coarse grains, and having a controlled orientation.

Another object of the present invention is to provide a method for preparing a perovskite compound film having a controlled orientation, using a solution coating method which is a low-cost simple process, and specifically, to provide a method for preparing a perovskite compound film having excellent crystallinity, being formed of extremely coarse grains, and having a controlled orientation.

Still another object of the present invention is to provide a device including a perovskite compound film having a controlled orientation.

Technical Solution

In one general aspect, an inorganic/organic hybrid perovskite compound film according to an exemplary embodiment of the present invention is a polycrystal, and has a discontinuous (100) plane scattering intensity on a grazing incidence wide angle X-ray scattering (GIWAXS) spectrum using an X-ray wavelength of 1.0688 Å.

In an exemplary embodiment according to a first aspect of the present invention, the inorganic/organic hybrid perovskite compound film may have 3 to 15 peaks, in a (100) plane scattering vector (q, Å$^{-1}$).

In an exemplary embodiment according to the first aspect of the present invention, a scattering spectrum is a scattering intensity distribution in which a scattering vector component $q_z$ is the y axis, and a scattering vector component $q_{xy}$ is the x axis, and among the (100) plane peaks, the strongest peak may be positioned at $q_{xy}=0$.

In an exemplary embodiment according to the first aspect of the present invention, the scattering spectrum may satisfy the following Equation 1:

$$2.0 \leq I_f/I_s \quad \text{(Equation 1)}$$

wherein $I_f$ is an intensity of the strongest peak among the (100) plane peaks, and $I_s$ is an intensity of the second strongest peak among the (100) plane peaks.

In another general aspect, an inorganic/organic hybrid perovskite compound film is a polycrystal, has a continuous scattering intensity in an azimuth range of 10 to 170°, based on the (100) plane scattering intensity depending on the azimuth, in a GIWAXS spectrum using an X-ray wavelength of 1.0688 Å, and has an orientation defined by the following Equation 2, which satisfies the following Equation 3:

$$PO(100)=I_{90}/I_{ave} \quad \text{(Equation 2)}$$

wherein PO(100) is an orientation in which the (100) plane is oriented in parallel to the film, $I_{90}$ is an intensity at an azimuth of 90°, based on the (100) plane scattering intensity depending on the azimuth, and Iave is an average scattering intensity in the azimuth range of 10 to 170°, based on the (100) plane scattering intensity depending on the azimuth, $$1.0 \leq PO(100) \leq 25. \quad \text{(Equation 3)}$$

In an exemplary embodiment according to the second aspect of the present invention, the inorganic/organic hybrid perovskite compound film may have uniformity defined by the following Equation 4, which satisfies the following Equation 5:

$$UF=\sigma/I_{ave} \quad \text{(Equation 4)}$$

wherein UF is uniformity, $I_{ave}$ is an average scattering intensity in the azimuth range of 10 to 170°, based on the (100) plane scattering intensity depending on the azimuth, and σ is a scattering intensity standard deviation in the azimuth range of 10 to 170°, $$0.1 \leq UF \leq 0.4. \quad \text{(Equation 5)}$$

In an exemplary embodiment according to the first and second aspects of the present invention, the inorganic/organic hybrid perovskite compound of the inorganic/organic hybrid perovskite compound film may satisfy the following Chemical Formula 1, 2 or 3:

$$AMX_3 \quad \text{(Chemical Formula 1)}$$

wherein A is a monovalent cation, which is an organic ammonium ion, an amidinium group ion, or an organic ammonium ion and an amidinium group ion, M is a divalent metal ion, and X is a halogen ion, $$A(M_{1-a}N_a)X_3 \quad \text{(Chemical Formula 2)}$$

wherein A is a monovalent cation, which is an organic ammonium ion, an amidinium group ion, or an organic ammonium ion and an amidinium group ion, M is a divalent metal ion, N is one or more doping metal ions selected from the group consisting of a monovalent metal ion and a trivalent metal ion, a is a real number of 0<a≤0.1, and X is a halogen ion, $$A(N^1_{1-b}N^2_b)X_3 \quad \text{(Chemical Formula 3)}$$

wherein A is a monovalent cation, which is an organic ammonium ion, an amidinium group ion, or an organic ammonium ion and an amidinium group ion, $N^1$ is a monovalent metal ion, $N^2$ is a trivalent metal ion, b is a real number of 0.4≤b≤0.6, and X is a halogen ion.

In still another general aspect, a method for preparing an inorganic/organic hybrid perovskite compound film includes steps of coating a perovskite compound solution containing an inorganic/organic hybrid perovskite compound and an additive which is an organic halide on a substrate, and bringing the coated perovskite compound solution into contact with a non-solvent of a perovskite compound and performing annealing to prepare the inorganic/organic hybrid perovskite compound film, wherein a crystal orientation of the inorganic/organic hybrid perovskite compound film is controlled by adjusting a content of the additive in the perovskite compound solution, that is, a mole ratio of the perovskite compound: the additive contained in the perovskite compound solution. That is, the method for preparing an inorganic/organic hybrid perovskite compound film according to the present invention includes a step of coating a perovskite compound solution containing an inorganic/organic hybrid perovskite compound and an additive which is an organic halide on a substrate, and a step of bringing the perovskite compound solution coated on the substrate into contact with a non-solvent of a perovskite compound and performing annealing to prepare the inorganic/organic hybrid perovskite compound film, wherein a crystal orientation of the inorganic/organic hybrid perovskite compound film is controlled by adjusting a content of the additive in the perovskite compound solution.

In the preparation method according to an exemplary embodiment of the present invention, the additive may be methylammonium halide.

In the preparation method according to an exemplary embodiment of the present invention, the perovskite compound solution may contain 0.2 to 0.7 mol of the additive based on 1 mol of the inorganic/organic hybrid perovskite compound.

In the preparation method according to an exemplary embodiment of the present invention, the perovskite compound solution may contain 0.75 to 1.5 mol of the additive based on 1 mol of the inorganic/organic hybrid perovskite compound.

In the preparation method according to an exemplary embodiment of the present invention, coating the perovskite solution and bringing the perovskite solution into contact with the non-solvent may be performed by sequential coating of the perovskite solution and the non-solvent using spin coating.

In still another general aspect, a device includes the inorganic/organic hybrid perovskite compound film according to the first aspect or the second aspect as described above.

The device according to an exemplary embodiment of the present invention may be an electronic device, a light emitting device, a memory device, a photovoltaic device, an optical sensor or a thermoelectric device.

Advantageous Effects

The perovskite compound film according to the present invention has an extremely excellent orientation, and is a highly crystalline film formed of coarse grains of a several micrometer order.

The preparation method according to the present invention may prepare a perovskite compound film having a controlled orientation, using simple solution coating, and may prepare a perovskite compound film composed of coarse grains, having a controlled orientation and excellent crystallinity.

BEST MODE

Figure 1:
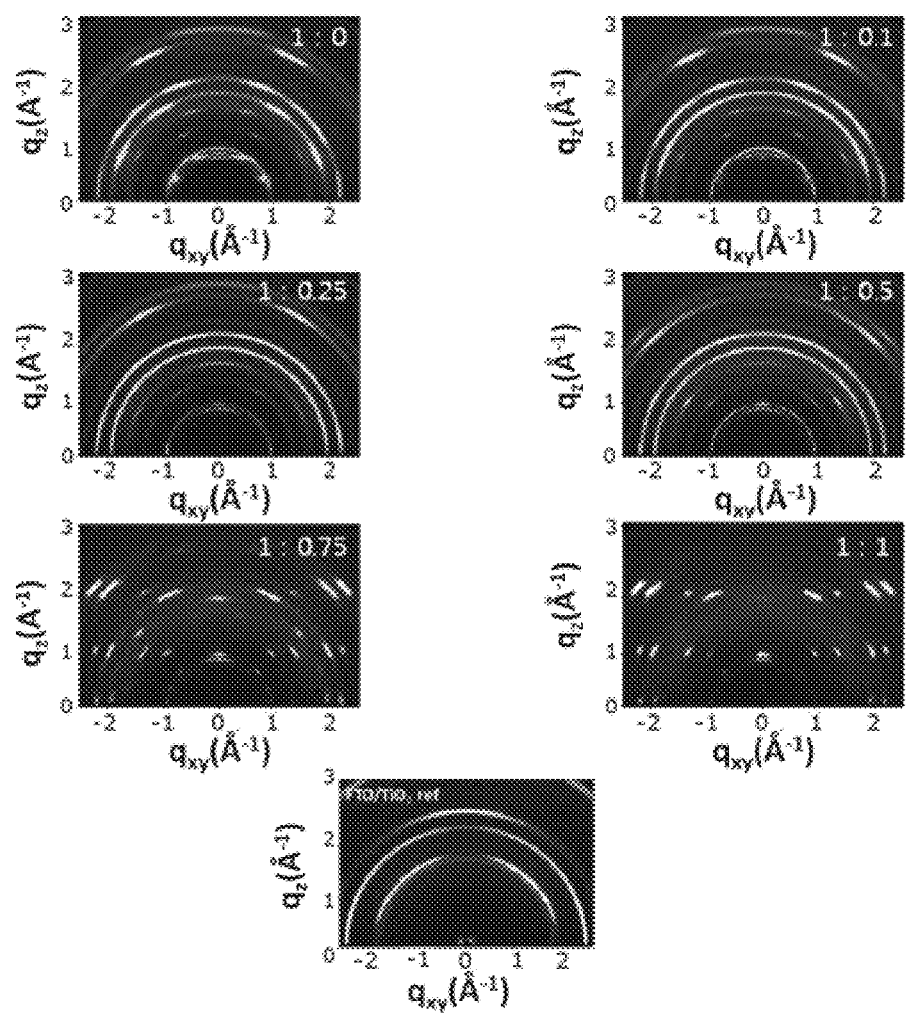
FIG. 1 is a drawing illustrating a GIWAXS spectrum depending on a content of an additive of a perovskite compound film prepared in Example 1.

Hereinafter, the present invention will be described in detail with reference to accompanying drawings. The drawings to be provided below are provided by way of example so that the idea of the present invention can be sufficiently transferred to a person skilled in the art to which the present invention pertains. Therefore, the present invention is not limited to the drawings provided below but may be embodied in many different forms, and the drawings suggested below may be exaggerated in order to clear the spirit of the present invention. Technical terms and scientific terms used herein have the general meaning understood by those skilled in the art to which the present invention pertains unless otherwise defined, and a description for the known function and configuration obscuring the gist of the present invention will be omitted in the following description and the accompanying drawings.

The present invention relates to an inorganic/organic hybrid perovskite compound film, a method for preparing the same, and a device including the inorganic/organic hybrid perovskite compound film.

In the present invention, the inorganic/organic hybrid perovskite compound is also commonly called, an organometal halide perovskite compound. The inorganic/organic hybrid perovskite compound (hereinafter, referred to as a perovskite compound) includes an organic cation (A), a metal cation (M) and a halogen anion (X), and has a perovskite structure. Specifically, the perovskite compound is in the form of a three-dimensional network in which a $MX_6$ octahedron is corner-shared, and an organic cation, A is positioned at the center.

As a first aspect, the present invention provides a perovskite compound film in which perovskite compound grains forming the perovskite compound film are highly oriented in a specific direction.

The inorganic/organic hybrid perovskite compound film according to the first aspect of the present invention (hereinafter, the perovskite compound film) is a polycrystal, and has a discontinuous (100) plane scattering intensity on a grazing incidence wide angle X-ray scattering (GIWAXS) spectrum using an X-ray wavelength of 1.0688 Å.

The (100) plane scattering intensity being discontinuous means that the plane (100) diffraction on the GIWAXS spectrum does not occur in all direction, and a diffraction peak occurs only at a specific azimuth. That is, it means that a spot-type diffraction pattern in the (100) plane appears on the GIWAXS spectrum.

Specifically, the (100) plane scattering intensity being discontinuous means that there is a region where a diffraction intensity by diffraction in the (100) plane is 0 in an azimuth range of 0 to 180° on the GIWAXS spectrum. Here, the case that the diffraction intensity is 0 naturally includes the case that an intensity of a noise level is detected.

More specifically, the (100) plane scattering intensity being discontinuous means that a (100) plane diffraction peak is present (diffraction by the (100) plane is detected) only at an azimuth of 85 to 95° in an azimuth range of 60 to 120° on the GIWAXS spectrum, and more specifically, a single diffraction peak at which a (100) plane diffraction peak center is positioned is present (diffraction by the (100) plane is detected) only at an azimuth of 85 to 95° in an azimuth range of 60 to 120° on the GIWAXS spectrum.

This discontinuous scattering pattern means that the perovskite compound film has an excellent crystal orientation, and the perovskite compound grains forming the film are oriented only in some specific directions where the diffraction peak is present.

Furthermore, the diffraction peak being present (the peak center being present) only at an azimuth of 85 to 95° in an azimuth range of 60 to 120° on the GIWAXS spectrum means that the (100) crystal plane is not optionally tilted and the (100) crystal plane of many crystals are oriented in parallel to the film, in the crystals forming the perovskite compound film.

Specifically, in an exemplary embodiment according to the first aspect of the present invention, there may be 3 to 15 peaks in a (100) plane scattering vector (q, Å$^{-1}$) on the GIWAXS spectrum. That is, there may be 3 to 15 diffraction peaks by (100) plane diffraction in an azimuth range of 0 to 180°. Substantially, the number of peaks having an intensity of 10% or more, based on the intensity of the strongest peak in the (100) plane scattering vector may be 3 to 5.

The number of diffraction peaks may correspond to the number of directions in which the (100) crystal plane is oriented, in the crystals forming the perovskite compound film. That is, 3 to 15 diffraction peaks by (100) plane diffraction being present means that the (100) crystal plane is present to be oriented only in 3 to 15 specific directions, in the crystals forming the perovskite compound film.

In addition, the number of peaks having an intensity of 10% or more, based on the intensity of the strongest peak being 3 to 5 means that the (100) planes of almost all crystals is present to be oriented in 3 to 5 directions, in the crystals forming the perovskite compound film.

A spot-type discontinuous GIWAXS spectrum, not an arc-type spectrum, and 3 to 15, substantially 3 to 5 peaks are indexes indicating an extremely excellent orientation of the perovskite compound film according to the first aspect of the present invention.

As a specific and non-limiting example, the diffraction peak by (100) plane diffraction in an azimuth range of 0 to 180° may be positioned at azimuths of 3 to 8°, 40 to 45°, 85 to 95° and 170 to 178°. As a more specific and non-limiting example, the number of peaks having an intensity of 10% or more, based on the intensity of the strongest peak may be 4, and the 4 peaks may be positioned at azimuths of 3 to 8°, 40 to 45°, 85 to 95° and 170 to 178°.

In an exemplary embodiment according to the first aspect of the present invention, the scattering spectrum of the perovskite compound film may be an intensity distribution in which a scattering vector component $q_z$ is the y axis, and a scattering vector component $q_{xy}$ is the x axis, and among the (100) plane peaks, the strongest peak may be positioned at $q_{xy}=0$. In other words, the strongest (100) plane peak may be positioned at an azimuth of 90° in an azimuth range of 0 to 180°.

This means that the crystals forming the perovskite compound film is oriented so that the (100) crystal plane is positioned in some specific directions, but almost all crystals are arranged so that the (100) crystal plane is in parallel to the film.

A degree of preferred orientation of the (100) crystal plane in a specific direction may be defined as a diffraction intensity on the GIWAXS spectrum. Specifically, in an azimuth range of 0 to 180°, the (100) plane diffraction peak may satisfy the following Equation 1:

$$2.0 \leq I_f/I_s \quad \text{(Equation 1)}$$

wherein $I_f$ is an intensity of the strongest peak among the (100) plane diffraction peaks, and $I_s$ is an intensity of the second strongest peak among the (100) plane diffraction peaks.

More characteristically, the perovskite compound film according to the first aspect of the present invention may have $I_f/I_s$ of 2.5 or more and substantially 10 or less.

$I_f/I_s$ of 2.0 or more, more characteristically 2.5 or more means that the (100) plane of extremely many grains among the grains forming the perovskite compound film is oriented in a direction parallel to the film.

An exemplary embodiment according to the first aspect of the present invention, the perovskite compound film may have a full width at half maximum (FWHM) of the azimuth of a diffraction peak being 5.5° or less, more characteristically 4.5° or less, the diffraction peak being positioned at an azimuth of 85 to 95°, more specifically 88 to 92°, substantially 90°, based on the (100) plane diffraction intensity depending on the azimuth of 0 to 180°. The narrow FWHM means that the (100) plane of many grains is oriented very strictly in a direction parallel to the film, and has a well-defined preferred orientation.

The (100) plane corresponds to a dense plane in a perovskite structure, and the perovskite compound film having a high orientation in which these dense planes are oriented in a direction parallel to the film may have excellent charge carrier mobility and a significantly low trap concentration, and significantly decrease charge scattering.

In an exemplary embodiment according to the first aspect of the present invention, the perovskite compound film may be formed of extremely coarse grains having an average grain size of 1 to 5 μm. The perovskite compound film having extremely coarse grains while having an orientation as described above may represent very similar characteristics to a single crystal.

As a second aspect, the present invention provides a perovskite compound film in which perovskite compound grains forming the perovskite compound film are randomly oriented.

In the case of preparing the perovskite compound film of a polycrystal, there is driving force to minimize surface energy which is energy between perovskite compound crystals and an atmosphere (atmosphere gas), grain boundary energy between crystals, interfacial energy between a different kind of substance positioned in a lower portion of the perovskite compound film and perovskite compound crystals, and the like. By the driving force, the perovskite compound film of the polycrystal may represent the preferred orientation in which grains are more oriented in a specific direction, together with a random arrangement of grains at the same time. That is, in the GIWAXS spectrum, being an intensity distribution in which the scattering component $q_z$ is the y axis, and the scattering vector component $q_{xy}$ is the x axis, the intensity is continuously detected regardless of the bearing in the scattering vector corresponding to a certain plane (as an example, the (100) plane), so that the scattering pattern forms a circular arc, however, the scattering intensity of some of the arcs represents a stronger pattern than that of other portions. However, the stronger pattern does not have the preferred orientation of the (100) plane as described above in the first aspect, that is, the orientation in which the (100) plane is positioned in parallel to a film (or substrate) surface, thereby deteriorating electrical properties.

As the second aspect, the present invention provides a perovskite compound film in which grains are substantially almost completely randomly arranged, by suppressing the preferred orientation which appears together with the random orientation. In addition, as the second aspect, the present invention provides a perovskite compound film having the preferred orientation in which the (100) plane is arranged in parallel to a film surface, together with the random orientation. As described above, when the (100) plane which is a dense film is arranged in parallel to the film, the plane may have better charge carrier mobility, and also a significantly lower trap concentration than other preferred orientation.

The inorganic/organic hybrid perovskite compound film according to the second aspect of the present invention is a polycrystal, has a continuous scattering intensity in an azimuth range of 10 to 170°, based on the (100) plane scattering intensity depending on the azimuth, in a GIWAXS spectrum using an X-ray wavelength of 1.0688 Å, and has an orientation defined by the following Equation 2 which satisfies the following Equation 3:

$$PO(100)=I_{90}/I_{ave} \quad \text{(Equation 2)}$$

wherein PO(100) is an orientation in which the (100) plane is oriented in parallel to the film, $I_{90}$ is an intensity at an azimuth of 90°, based on the (100) plane scattering intensity depending on the azimuth, and $I_{ave}$ is an average scattering intensity in the azimuth range of 10 to 170°, based on the (100) plane scattering intensity depending on the azimuth, $$1.0 \leq PO(100) \leq 25. \quad \text{(Equation 3)}$$

In the above-described Equation 2, PO(100) means a degree of parallel orientation of (100) plane grains to the perovskite compound film, in the orientation of the grains forming the perovskite compound film. In Equation 3, PO(100) of 1.0 or more means that a random orientation is dominant, but the preferred orientation in which the (100) plane is oriented in parallel to the film does not substantially appear, or appears very weak, and PO(100) of 5 or more means that preferred orientation in which the (100) plane is oriented in parallel to the film appears clearly together with a random orientation. Furthermore, PO(100) of 15 to 25 means that a large amount of grains has the preferred orientation in which the (100) plane is oriented in parallel to the film.

As an exemplary embodiment according to the second aspect, the present invention provides a perovskite compound film having an extremely random orientation, and the inorganic/organic hybrid perovskite compound film having a random orientation is a polycrystal, has a continuous scattering intensity in an azimuth range of 10 to 170°, based on the (100) plane scattering intensity depending on the azimuth, in a GIWAXS spectrum using an X-ray wavelength of 1.0688 Å, and has uniformity defined by the following Equation 4, which satisfies the following Equation 5:

$$UF = \sigma/I_{ave} \quad \text{(Equation 4)}$$

wherein UF is uniformity, $I_{ave}$ is an average scattering intensity in the azimuth range of 10 to 170°, based on the (100) plane scattering intensity depending on the azimuth, and σ is a scattering intensity standard deviation in the azimuth range of 10 to 170°, $$0.1 \leq UF \leq 0.4. \quad \text{(Equation 5)}$$

The uniformity defined in Equation 4 being 0.1 to 0.4, more specifically 0.1 to 0.3 means that the film is a polycrystal film in which perovskite compound grains forming the perovskite compound film are extremely randomly arranged. When the perovskite compound film satisfies Equations 4 and 5, PO(100) according to the above Equation 2 may be 1.0 to 2.0. The uniformity of 0.1 to 0.4 has not been implemented by a conventional method for forming a polycrystal perovskite compound film on a substrate including a solution coating method.

As an exemplary embodiment according to the second aspect, the present invention provides a perovskite compound film having a random orientation, but also having the preferred orientation in which the (100) plane is in parallel to the film, at the same time. The inorganic/organic hybrid perovskite compound film is a polycrystal, has a continuous scattering intensity in an azimuth range of 10 to 170°, based on the (100) plane scattering intensity depending on the azimuth, in a GIWAXS spectrum using an X-ray wavelength of 1.0688 Å, and has PO(100) defined by Equation 3, which may satisfy 5 to 25, substantially 5 to 15, and more substantially 5 to 10. The perovskite compound film having PO(100) which satisfies 5 to 25, substantially 5 to 15, and more substantially 5 to 10 may have a structure in which a random orientation having diffraction in all directions and also a preferred orientation in which the (100) plane is oriented in parallel to the film are developed at the same time.

In an exemplary embodiment according to the second aspect of the present invention, the perovskite compound film may be formed of coarse grains having an average grain size of 500 nm to 3 μm.

Hereinafter, the detailed constitution of the perovskite compound film according to the first and second aspects will be described, and unless otherwise defined by specifying certain embodiments, the description corresponds to both the perovskite compound film according to the first aspect, and the perovskite compound film according to the second aspect.

For the perovskite compound film according to an exemplary embodiment of the present invention, the GIWAXS spectrum of the perovskite compound film may be measured under the condition of an incidence angle of 0.3° using X-ray at λ=1.0688 Å(11.6 keV) having a beam size of 150 μm (h)×120 μm (v) (FWHM: full width at half maximum), and obtained by capturing a diffraction pattern using a two-dimensional area detector, the detector may be disposed at 246.4118 m, m from a sample for GIWAXS measurement, and the measurement area of the sample may be 0.1 mm² to 20 mm².

For the perovskite compound film according to an exemplary embodiment of the present invention, the perovskite compound may satisfy the following Chemical Formula 1, 2 or 3:

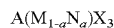

AMX₃ (Chemical Formula 1)

wherein A is monovalent cation, which is an organic ammonium ion, an amidinium group ion, or an organic ammonium ion and an amidinium group ion, M is a divalent metal ion, and X is a halogen ion. Herein, the halogen ion may be one or two or more selected from the group consisting of I⁻, Br⁻, F⁻ and Cl⁻.

$$A(M_{1-a}N_a)X_3 \quad \text{(Chemical Formula 2)}$$

wherein A is a monovalent cation, which is an organic ammonium ion, an amidinium group ion, or an organic ammonium ion and an amidinium group ion, M is a divalent metal ion, N is one or more doping metal ions selected from the group consisting of a monovalent metal ion and a trivalent metal ion, a is a real number of 0<a≤0.1, and X is a halogen ion. Herein, the halogen ion may be one or two or more selected from the group consisting of I⁻, Br⁻, F⁻ and Cl⁻.

In Chemical Formula 2, the monovalent metal ion which is a doping metal ion may be one or two or more selected from the group consisting of Li⁺, Na⁺, K⁺, Rb⁺, Cs⁺, In¹⁺, Cu¹⁺ and Ag¹⁺ ions.

In Chemical Formula 2, the trivalent metal ion which is a doping metal ion may be one or two or more selected from the group consisting of Al³⁺, Ga³⁺, In³⁺, Tl³⁺, Sc³⁺, Y³⁺, La³⁺, Ce³⁺, Fe³⁺, Ru³⁺, Cr³⁺, V³⁺, Ti³⁺, Sb³⁺, Bi³⁺ and As³⁺ ions.

Like Chemical Formula 2, when the monovalent metal ion and/or the trivalent metal ion is doped, the electrical property of the perovskite compound may be adjusted to n-type or p-type. Specifically, the perovskite compound may be p-type by being doped with the monovalent metal ion. In addition, the perovskite compound may be n-type by being doped with the trivalent metal ion. That is, the monovalent metal ion is similar to an acceptor doped in a common silicon semiconductor, and the trivalent metal ion is similar to a donor doped in a common silicon semiconductor. Here, both the monovalent metal ion and the trivalent metal ion may be doped, and it is natural that the overall electrical properties of the perovskite compound may be adjusted by the metal ion type contained in a larger amount.

In Chemical Formula 1 or 2, M may be a divalent metal ion. As a specific example, M may be one or two or more metal ions selected from the group consisting of Cu²⁺, Ni²⁺, Co²⁺, Fe²⁺, Mn²⁺, Cr²⁺, Pd²⁺, Cd²⁺, Ge²⁺, Sn²⁺, Pb²⁺ and Yb²⁺.

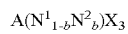

$$A(N^1_{1-b}N^2_b)X_3 \quad \text{(Chemical Formula 3)}$$

wherein A is a monovalent cation, which is an organic ammonium ion, an amidinium group ion, or an organic ammonium ion and an amidinium group ion, N¹ is a monovalent metal ion, N² is a trivalent metal ion, b is a real number of 0.4≤b≤0.6, and X is a halogen ion.

In Chemical Formula 3, the monovalent metal ion may be one or two or more selected from the group consisting of In¹⁺, Cu¹⁺ and Ag¹⁺, in terms of a band gap appropriate for sunlight absorption and a small hole effective mass.

In Chemical Formula 3, the trivalent metal ion may be one or two or more selected from the group consisting of Al³⁺, Ga³⁺, In³⁺, Tl³⁺, Sc³⁺, Y³⁺, La³⁺, Ce³⁺, Fe³⁺, Ru³⁺, Cr³⁺, V³⁺, Ti³⁺, Sb³⁺, Bi³⁺ and As³⁺ ions, and may be one or two or more selected from the group consisting of Sb³⁺, Bi³⁺, Ga³⁺ and In³⁺, in terms of a band gap appropriate for sunlight absorption and a small electron effective mass.

More preferably, metal ion pairs of monovalent metal ion-trivalent metal ion may be the following i) to v) having a direct transition type band gap structure, band gap energy appropriate for sunlight absorption, and significantly small hole effective mass and electron effective mass of an order of $10^{-2}$:

i) $In^{1+}$—$Sb^{3+}$
ii) $In^{1+}$—$Bi^{3+}$
iii) $Cu^{1+}$—$In^{3+}$
iv) $Ag^{1+}$—$In^{3+}$
v) $Ag^{1+}$—$Ga^{3+}$ wherein b=0.5, and in this case, the perovskite compound may have a double-layered perovskite structure, not a simple perovskite structure. The double-layered perovskite structure is a crystal lattice structure in which a monovalent metal ion ($N^1$) and a trivalent metal ion ($N^2$) are regularly arranged on an M-site of the single perovskite structure, and may be represented by a chemical formula of $A_2N^1N^2X_6$. As is well known, the double-layered perovskite structure is in the form of a three-dimensional network in which a $N^1X_3$ octahedron and a $N^2X_3$ octahedron are regularly alternated with each other and corner-shared, and an organic cation is positioned at the center. The double-layered perovskite structure may belong to a Fm-3m(Fm$\bar{3}$m) space group of a cubic crystal system.

In Chemical Formula 1, 2 or 3, the organic ammonium ion may satisfy the following Chemical Formulae 4 and 5:

   (Chemical Formula 4)

wherein $R_1$ is C1-C24 alkyl, C3-C20 cycloalkyl or C6-C20 aryl,

   (Chemical Formula 5)

wherein $R_2$ is C1-C24 alkyl, C3-C20 cycloalkyl or C6-C20 aryl, and $R_3$ is hydrogen or C1-C24 alkyl.

In Chemical Formula 1, 2 or 3, an amidinium group ion may satisfy the following Chemical Formula 6:

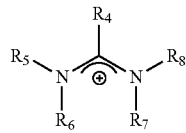   (Chemical Formula 6)

wherein $R_4$ to $R_8$ are independently of one another hydrogen, C1-C24 alkyl, C3-C20 cycloalkyl, or C6-C20 aryl.

In Chemical Formula 1, 2 or 3, A may be an organic ammonium ion, an amidinium group ion, or an organic ammonium ion and an amidinium group ion. When A contains both the organic ammonium ion and the amidinium group ion, charge carrier mobility of the perovskite compound may be significantly improved.

In the case that A contains both the organic ammonium ions and the amidinium group ion, 0.7 to 0.95 mol of the amidinium group ion and 0.3 to 0.05 mol of the organic ammonium group ion may be contained, based on a total of 1 mol of the monovalent organic cation. That is, in Chemical formula 1, 2 or 3, A may be $A^a_{(1-x)}A^b_x$ in which $A^a$ is an amidinium group ion, $A^b$ is an organic ammonium ion, and x is a real number of 0.3 to 0.05. A mole ratio between the amidinium group ion and the organic ammonium ion, that is, a mole ratio of 0.7 to 0.95 mol of the amidinium group ion: 0.3 to 0.05 mol of the organic ammonium ion is a range in which light of a very broad wavelength band may be absorbed, and more rapid movement and separation of excitons, and more rapid movement of photoelectrons and light holes may be made.

$R_1$ in Chemical Formula 4, $R_2$-$R_3$ in Chemical Formula 5, and/or $R_4$-$R_8$ in Chemical Formula 6 may be properly selected depending on the use of the perovskite compound.

Specifically, a unit cell size of the perovskite compound has an influence on the band gap of the perovskite compound. Accordingly, considering the use of the perovskite compound film such as a semiconductor channel layer, a light emitting layer, a semiconductor layer, a light absorbing layer and a charge storage layer, $R_1$ in Chemical Formula 4, $R_2$-$R_3$ in Chemical Formula 5, and/or $R_4$-$R_8$ in Chemical Formula 6 may be properly adjusted so that the perovskite compound has a band gap appropriate for use, which is well known to those related to a semiconductor device or an optical device.

As a specific example, the perovskite compound may have band gap energy of 1.5-1.1 eV which is appropriate for being used as a solar cell absorbing sunlight in a small-sized unit cell. Accordingly, when band gap energy of 1.5-1.1 eV appropriate for utilization as a solar cell is considered, in Chemical Formula 4, $R_1$ may be C1-C24 alkyl, specifically C1-C7 alkyl, more specifically methyl. Further, in Chemical Formula 5, $R_2$ may be C1-C24 alkyl, $R_3$ may be hydrogen or C1-C24 alkyl, specifically $R_2$ may be C1-C27 alkyl, and $R_3$ may be hydrogen or C1-C7 alkyl, and more specifically $R_2$ may be methyl, and $R_3$ may be hydrogen. Further, in Chemical Formula 6, $R_4$ to $R_8$ may be independently of each other, hydrogen, amino or C1-C24 alkyl, specifically hydrogen, amino or C1-C7 alkyl, more specifically, hydrogen, amino or methyl, and more specifically $R_4$ may be hydrogen, amino or methyl, and $R_5$ to $R_8$ may be hydrogen. As a specific and non-limiting example, the amidinium group ion may be a formamidinium ion ($NH_2CH=NH_2^+$), an acetamidinium ion ($NH_2C(CH_3)=NH_2^+$), a guamidinium ion ($NH_2C(NH_2)=NH_2^+$), or the like.

As described above, specific examples of the organic cation (A) may be an example considering the use of the perovskite compound film, that is, the use as the light absorbing layer of sunlight, and $R_1$ in Chemical Formula 4, $R_2$ and $R_3$ in Chemical Formula 5, and $R_4$-$R_8$ in Chemical formula 6 may be appropriately selected, considering the characteristics required for use such as the design of a wavelength band of the light to be absorbed, the design of an emission wavelength band in the case of use as a light emitting layer of a light emitting device, an energy band gap and threshold voltage in the case of use as a semiconductor device of a transistor, and the like.

In Chemical Formula 1 or 2, M may be a divalent metal ion. As a specific example, M may be one or two or more metal ions selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$ and $Yb^{2+}$.

In Chemical Formula 1, 2 or 3, X is a halogen anion. The halogen anion may be one or two or more selected from the group consisting of $I^-$, $Br^-$, $F^-$ and $Cl^-$. Specifically, the halogen anion may include one or two or more ions selected from the group consisting of an iodide ion ($I^-$), a chloride ion ($Cl^-$) and a bromide ion ($Br^-$). More specifically, the halogen anion may include an iodide ion and a bromide ion. When the halogen anion includes both an iodide ion and a bromide ion, the crystallinity and moisture resistance of the perovskite compound may be improved.

As a specific example, in Chemical Formula 1, 2 or 3, X may be $X^a_{(1-y)}X^b_y$, in which $X^a$ and $X^b$ are different halogen ions from each other (different halogen ions from each other selected from the group consisting of iodide ion ($I^-$), chloride ion ($Cl^-$) and bromide ion ($Br^-$)), and y is a real number of $0<y<1$. More specifically, in Chemical Formula 1, X may be $X^a_{(1-y)}X^b_y$, in which $X^a$ is an iodide ion, $X^b$ is a bromide ion, and y is a real number of $0.05 \leq y \leq 0.3$, specifically, a real number of $0.1 \leq x \leq 0.15$. That is, in order to significantly prevent deterioration due to moisture and have excellent crystallinity even in a process at a low temperature of 100° C. or less, when the halogen anion includes both an iodide ion and a bromide ion, 0.7 to 0.95 mol of the iodide ion and 0.3 to 0.05 mol of the bromide ion may be contained, based on a total of 1 mol of the anions.

Based on the above description, as an example of the specific and non-limiting perovskite compound in which M is $Pb^{2+}$, the perovskite compound may be $CH_3NH_3PbI_xCl_y$, (x is a real number of $0 \leq x \leq 3$, y is a real number of $0 \leq y \leq 3$, and x+y=3), $CH_3NH_3PbI_xBr_y$ (x is a real number of $0 \leq x \leq 3$, y is a real number of $0 \leq y \leq 3$, and x+y=3), $CH_3NH_3PbCl_xBr_y$ (x is a real number of $0 \leq x \leq 3$, y is a real number of $0 \leq y \leq 3$, and x+y=3), $CH_3NH_3PbI_xF_y$ (x is a real number of $0 \leq x \leq 3$, y is a real number of $0 \leq y \leq 3$, and x+y=3), $NH_2CH=NH_2PbI_xCl_y$ (x is a real number of $0 \leq x \leq 3$, y is a real number of $0 \leq y \leq 3$, and x+y=3), $NH_2CH=NH_2PbI_xBr_y$ (x is a real number of $0 \leq x \leq 3$, y is a real number of $0 \leq y \leq 3$, and x+y=3), $NH_2CH=NH_2PbCl_xBr_y$ (x is a real number of $0 \leq x \leq 3$, y is a real number of $0 \leq y \leq 3$, and x+y=3), $NH_2CH=NH_2PbI_xF_y$ (x is a real number of $0 \leq x \leq 3$, y is a real number of $0 \leq y \leq 3$, and x+y=3), $NH_2CH=NH_{2(1-x)}CH_3NH_{3x}Pb(I_{1-y}Br_y)_3$ (x is a real number of $0<x<1$, and y is a real number of $0<y<1$), $NH_2CH=NH_{2(1-x)}CH_3NH_{3x}Pb(I_{(1-y)}Br_y)_3$ (x is a real number of $0.05 \leq x \leq 0.3$, and y is a real number of $0.05 \leq y \leq 0.3$), $NH_2CH=CH_{2(1-x)}CH_3NH_{3x}Pb(I_{(1-x)}Br_x)_3$ (x is a real number of $0.05 \leq x \leq 0.3$), $NH_2C(CH_3)=NH_2PbI_xCl_y$ (x is a real number of $0 \leq x \leq 3$, y is a real number of $0 \leq y \leq 3$, and x+y=3), $NH_2C(CH_3)=NH_2PbI_xBr_y$ (x is a real number of $0 \leq x \leq 3$, y is a real number of $0 \leq y \leq 3$, and x+y=3), $NH_2C(CH_3)=NH_2PbCl_xBr_y$ (x is a real number of $0 \leq x \leq 3$, y is a real number of $0 \leq y \leq 3$, and x+y=3), $NH_2C(CH_3)=NH_2PbI_xF_y$ (x is a real number of $0 \leq x \leq 3$, y is a real number of $0 \leq y \leq 3$, and x+y=3), $NH_2C(CH_3)=NH_{2(1-x)}CH_3NH_{3x}Pb(I_{(1-y)}Br_y)_3$ (x is a real number of $0<x<1$, and y is a real number of $0<y<1$), $NH_2C(CH_3)=NH_{2(1-x)}CH_3NH_{3x}Pb(I_{(1-y)}Br_y)_3$ (x is a real number of $0.05 \leq x \leq 0.3$, y is a real number of $0.05 \leq y \leq 0.3$), $NH_2C(CH_3)=CH_{2(1-x)}CH_3NH_{3x}Pb(I_{(1-x)}Br_x)_3$ (x is a real number of $0.05 \leq x \leq 0.3$), $NH_2C(NH_2)=NH_2PbI_xCl_y$ (x is a real number of $0 \leq x \leq 3$, y is a real number of $0 \leq y \leq 3$, and x+y=3), $NH_2C(NH_2)=NH_2PbI_xBr_y$ (x is a real number of $0 \leq x \leq 3$, y is a real number of $0 \leq y \leq 3$, and x+y=3), $NH_2C(NH_2)=NH_2PbCl_xBr_y$ (x is a real number of $0 \leq x \leq 3$, y is a real number of $0 \leq y \leq 3$, and x+y=3), $NH_2C(NH_2)=NH_2PbI_xF_y$ (x is a real number of $0 \leq x \leq 3$, y is a real number of $0 \leq y \leq 3$, and x+y=3), $NH_2C(NH_2)=NH_{2(1-x)}CH_3NH_{3x}Pb(I_{(1-y)}Br_y)_3$ (x is a real number of $0<x<1$, y is a real number of $0<y<1$), $NH_2C(NH_2)=NH_{2(1-x)}CH_3NH_{3x}Pb(I_{(1-y)}Br_y)_3$ (x is a real number of $0.05 \leq x \leq 0.3$, and y is a real number of $0.05 \leq y \leq 0.3$), or $NH_2C(NH_2)=CH_{2(1-x)}CH_3NH_{3x}Pb(I_{(1-x)}Br_x)_3$ (x is a real number of $0.05 \leq x \leq 0.3$).

For the perovskite compound film according to an exemplary embodiment of the present invention, a thickness of the perovskite compound film may be properly adjusted considering the use, but as a specific example, the thickness may be 10 nm to 1 μm. When the use of a solar cell is considered, the thickness of the perovskite compound film may be 100 to 800 nm.

The present invention provides a method for preparing a perovskite compound film having a controlled crystal orientation.

The present applicant has provided technology to control a protruding structure of a light absorbing structure, by having a different mole ratio between an organic halide and a metal halide in a light absorber solution, when forming a perovskite compound, in Korean Patent Laid-Open Publication No. 2014-0091489. In addition, the present applicant has provided technology to prepare a light absorbing structure of a perovskite compound having a low surface roughness and a dense film shape, in Korean Patent Laid-Open Publications Nos. 2014-0035285, 2014-0035284 and 2014-0035286. As an extension of the studies, every effort was devoted to improve physical properties of a perovskite compound itself for further increasing battery efficiency, and as a result, it was surprisingly found that in the case of adding an organic halide as an additive to a solution of a perovskite compound dissolved in a solvent, and then coating the solution and bringing a non-solvent into contact with the coated solution, an orientation of a perovskite compound film may be controlled by a content of the additive which is the organic halide.

In addition, as a result of reviewing an influence of various organic halides as an additive on the orientation of a film, it was found that when a methylammonium halide is used as the additive, more than any organic halide, the orientation of the film is surprisingly controlled from an extremely random arrangement to a highly specified orientation by only controlling an amount of the additive, and thus, the control is done stably and reproducibly.

The preparation method according to the present invention based on these findings includes steps of coating a perovskite compound solution containing an inorganic/organic hybrid perovskite compound and an additive which is an organic halide on a substrate, and bringing the coated perovskite compound solution into contact with a non-solvent of a perovskite compound and performing annealing to prepare the inorganic/organic hybrid perovskite compound film, wherein a crystal orientation of the inorganic/organic hybrid perovskite compound film is controlled by adjusting a content of the additive in the perovskite compound solution.

Here, it is preferred that the additive is methylammonium halide. When the methylammonium halide is used as the additive, more than any organic halide, the orientation of the film is surprisingly controlled from an extremely random arrangement to a highly specified orientation, by only adjusting the mole ratio of the additive relative to the perovskite compound contained in the perovskite compound solution, and thus, the control may be done stably and reproducibly. Methylammonium halide may include methylammonium chloride, methylammonium bromide, methylammonium iodide, methylammonium fluoride or a mixture thereof, and more preferably may be methylammonium chloride.

The substrate may be properly designed considering the use of the perovskite compound film. Specifically, the substrate may be a rigid substrate or a flexible substrate, and independently of this, may be a transparent or opaque substrate. Crystallographically, the substrate may be a single crystal, a polycrystal or an amorphism, or a mixed phase of a crystal phase and an amorphous phase. As an example, the substrate may be a laminate in which a semiconductor, ceramic, a metal, a polymer, or two or more materials selected therefrom form each layer and are laminated. A non-limiting example of the semiconductor substrate may include a laminate in which a Group 4 semiconductor including silicon (Si), germanium (Ge) or silicon germanium (SiGe), a Group 3-5 semiconductor including gallium arsenide (GaAs), indium phosphide (InP) or gallium phosphide (GaP), a Group 2-6 semiconductor including cadmium sulfide (CdS) or zinc telluride (ZnTe), a Group 4-6 semiconductor including lead sulfide (PbS), or two or more materials selected therefrom form each layer and are laminated. A non-limiting example of the ceramic substrate may include a laminate in which a semiconductor oxide, a semiconductor nitride, a semiconductor carbide, a metal oxide, a metal carbide, a metal nitride, or two or more materials selected therefrom form each layer and are laminated. Here, the semiconductor of the semiconductor oxide, the semiconductor nitride or the semiconductor carbide may include the Group 4 semiconductor, the Group 3-5 semiconductor, the Group 2-6 semiconductor, the Group 4-6 semiconductor, or the mixture thereof. A non-limiting example of the metal substrate may include transition metals including precious metals, metals or a mixture thereof. A non-limiting example of the polymer substrate may include polyethylene terephthalate (PET), polyethylene naphthalate (PEN), polyimide (PI), polycarbonate (PC), polypropylene (PP), triacetylcellulose (TAC), polyethersulfone (PES), polydimethylsiloxane (PDMS), or a mixture thereof.

A specific example of the substrate considering the use as a solar cell, the substrate may include an amorphous oxide substrate such as glass, or a flexible polymer substrate such as polyethylene terephthalate (PET), polyethylene naphthalate (PEN), polyimide (PI), polycarbonate (PC), polypropylene (PP), triacetylcellulose (TAC), polyethersulfone (PES) or polydimethylsiloxane (PDMS), and the like.

Here, depending on a basic structure of a device provided with the organic/inorganic hybrid perovskite compound film, for example, an electronic device such as a transistor, a light emitting device which generates light such as a light emitting diode or laser, a memory device, a thermoelectric device, a photovoltaic device (solar cell), an optical sensor, and the like, subcomponents of a lower portion of the perovskite compound film may be subjected to proper design modification. That is, the substrate may have previously formed subcomponents which are disposed in a lower portion of the perovskite compound film of the device to be manufactured, based on a previously known device structure.

In the preparation method according to an exemplary embodiment of the present invention, the perovskite compound solution may contain a monovalent organic cation (A), a metal cation (M) and a halogen anion (X) so that Chemical Formulae 1 to 3 are satisfied, and independently of this, the solution may have the perovskite compound itself dissolved in a solvent together with an additive. The solution may contain a solvent which dissolves an organic cation (A), a divalent metal cation (M) and a halogen anion (X).

A molar concentration of the perovskite compound in the perovskite compound solution may be 0.4 M to 1.8 M, specifically 0.8 M to 1.1 M, but not limited thereto.

The solvent of the perovskite compound solution may be any solvent as long as the solvent is a polar organic solvent which dissolves the perovskite compound and the additive. A specific and non-limiting example of the solvent may be one or two or more selected from the group consisting of γ-butyrolactone, formamide, dimethylformamide, diformamide, acetonitrile, tetrahydrofuran, dimethylsulfoxide, diethyleneglycol, 1-methyl-2-pyrrolidone, N,N-dimethylacetamide, acetone, α-terpineol, β-terpineol, dihydroterpineol, 2-methoxyethanol, acetylacetone, methanol, ethanol, propanol, ketone, methylisobutylketone and the like.

The perovskite compound solution may contain 0.2 to 0.7 mol, substantially 0.2 to 0.55 mol of the additive, based on 1 mol of the perovskite compound contained in the solution. Preferably, the perovskite compound solution may contain 0.2 to 0.7 mol, preferably 0.2 to 0.55 mol of methylammonium halide, based on 1 mol of the perovskite compound contained in the solution. When the perovskite compound solution having the content is coated on the substrate, and then brought into contact with a non-solvent, the perovskite compound film according to the second aspect may be prepared.

Furthermore, when the perovskite compound solution contains 0.2 to 0.3 mol of methylammonium halide, based on 1 mol of the perovskite compound contained in the solution, the preferred orientation is significantly suppressed to prepare the perovskite compound film having an extremely random orientation. In addition, when the perovskite compound solution contains 0.35 to 0.55 mol, specifically 0.45 to 0.55 mol of methylammonium halide, based on 1 mol of the perovskite compound contained in the solution, the perovskite compound film having the preferred orientation in which the (100) crystal plane is in parallel to a film surface while having a random orientation may be prepared.

The perovskite compound solution may contain 0.75 to 1.5 mol, preferably 0.9 to 1.5 mol of the additive, based on 1 mol of the perovskite compound contained in the solution. Preferably, the perovskite compound solution may contain 0.75 to 1.5 mol, preferably 0.9 to 1.5 mol of methylammonium halide, based on 1 mol of the perovskite compound contained in the solution. When the perovskite compound solution having the content is coated on the substrate, and then brought into contact with a non-solvent, the perovskite compound film according to the first aspect may be prepared.

Coating of the perovskite compound solution may be carried out by any coating method as long as the method is commonly used for forming a film by coating a liquid phase. However, among various coating methods, it is more advantageous to use spin coating, in terms of uniform coating of a liquid, large area treatment and a rapid process time.

As described above, the orientation of the perovskite compound film may be controlled, only by coating the perovskite compound solution containing the additive, while the coated perovskite compound solution is brought into contact with a non-solvent (a non-solvent of the perovskite compound).

The non-solvent may be an organic solvent which does not dissolve the perovskite compound, and a nonpolar organic solvent. Specifically, the non-solvent may be a nonpolar solvent having permittivity (c; relative permittivity) of 20 or less, substantially 1 to 20. As a specific example, the non-solvent may be one or two or more selected from the group consisting of pentyne, hexane, cyclohexene, 1,4-dioxene, benzene, toluene, triethylamine, chlorobenzene, ethylamine, ethylether, chloroform, ethylacetate, acetic acid, 1,2-dichlorobenzene, tert-butylalcohol, 2-butanol, isopropanol and methylethylketone, but not limited thereto.

After the perovskite compound solution is coated and before the solvent of the perovskite compound solution coated on the substrate is all volatilized and removed, that is, all dried, the non-solvent is coated, thereby bringing the coated light absorber solution into contact with the non-solvent. Here, considering the volatility of the solvent contained in the perovskite compound solution, coating of the perovskite compound solution and coating of the non-solvent may be carried out independently and sequentially, or coating of the non-solvent may be carried out during coating of the perovskite compound solution. Spin coating is also preferred for the coating of the non-solvent, in terms of uniform coating of a liquid, large area treatment and a rapid process time. As a substantial example, coating of the light absorber solution and coating of the non-solvent may be all carried out by spin coating. In this case, after the coating of the perovskite compound solution using spin coating is completed, the non-solvent is injected to a rotation center of spin coating to coat the nonsolvent, or after the perovskite compound solution is injected to a rotation center, the non-solvent is injected to a rotation center during spinning of the substrate for evenly dispersing the injected light absorber solution. Considering the size of the device to be manufactured and the volatility of the solvent contained in the perovskite compound solution, a time interval between the time when injection of the surface layer preparation solution to the rotation center of spin coating is completed and the time when the non-solvent is injected, may be properly adjusted, however, as a specific and non-limiting example, the non-solvent may be injected 1 to 100 seconds immediately after injection of the perovskite compound solution is completed. For more details of the 2-step coating process which is coating of perovskite compound solution and contact of the non-solvent, Korean Patent Laid-Open Publications Nos. 2014-0035285, 2014-0035284 and 2014-0035286 which are all issued to the present applicant may be referenced, and the present invention includes the descriptions of Korean Patent Laid-Open Publications Nos. 2014-0035285, 2014-0035284 and 2014-0035286.

Annealing is carried out for volatilizing and removing the residual solvent or non-solvent of the perovskite compound solution, simultaneously with removing the additive. The annealing may be carried out at a temperature of 100 to 150° C., preferably 130 to 150°. Annealing time is a period during which the additive is stably removed, and as a specific example, may be 1 minute to 10 minutes, but not limited thereto.

The present invention includes an electronic device, an optical device, a memory device, a thermoelectric device or a sensor including the perovskite-based compound film (the first or second aspect perovskite compound film) as described above.

The electronic device includes a transistor, the optical device includes a light emitting device including a light-emitting diode or laser, a light detecting device (light sensor) or a photovoltaic device (solar cell), the memory device includes a volatile or non-volatile memory device, and the sensor includes a detection sensor for detecting an organic compound or a biochemical material.

As an example, the present invention includes a light emitting diode having a light emitting layer containing the above-described perovskite-based compound film, based on a structure of a first electrode-an n-type semiconductor (electron carrier)-a light emitting layer-a p-type semiconductor (hole carrier)-a second electrode, which is a basic structure of the light emitting diode.

As an example, the present invention includes a resistive random access memory having a semiconductor containing the above-described perovskite-based compound film, based on a structure of a first electrode-a semiconductor-a second electrode, which is a basic structure of the resistive random access memory. Here, as is well known, the first electrode may be metal strips which are arranged to be spaced apart in one direction from each other, and the second electrode may be metal strips which are arranged to be spaced apart in other one direction from each other so that the metal strips are orthogonal to the metal strips of the first electrode.

As an example, the present invention includes the transistor having a semiconductor channel containing the above-described perovskite-based compound film, based on a structure of a source and a drain which are spaced apart from each other and face each other, a semiconductor channel disposed between the source and the drain, and a gate disposed in the upper portion or lower portion of the semiconductor channel, with an insulating film (gate insulating film) interposed therebetween, which is a basic structure of the transistor.

As described above, it is apparent to any person skilled in the art of an electronic device such as a transistor, a light emitting device for generating light, a memory device, a photovoltaic device (solar cell), and the like that the device may be implemented by subjecting the components including the above-described perovskite-based compound film to design modification appropriate for the device, based on the known structure of the desired device.

Among various applications of the perovskite compound, application to a solar cell which is commercially important will be described in detail.

The present invention includes a solar cell containing the above-described perovskite-based compound film as a light absorbing layer.

The solar cell according to an exemplary embodiment of the present invention may include a first electrode, a first charge carrier disposed on the first electrode, a light absorber including the perovskite-based compound film disposed on the first charge carrier, a second charge carrier disposed on the light absorber, and a second electrode disposed on the second charge carrier.

The first electrode may be disposed on a substrate, and the substrate may be a rigid substrate or a flexible substrate. As a specific example, the substrate may be a rigid substrate including a glass substrate, or a flexible substrate including polyethylene terephthalate (PET); polyethylene naphthalate (PEN); polyamide (PI); polycarbonate (PC); polypropylene (PP); triacetylcellulose (TAC); polyethersulfone, and the like. However, the present invention is not limited to those kinds of substrates, of course.

The first electrode is any conductive electrode which is ohmic-joined to the first charge carrier, and any material commonly used as an electrode material of a front electrode or a back electrode in a solar cell may be used. As a non-limiting example, when the first electrode is the electrode material of a back electrode, the first electrode may be one or more materials selected from the group consisting of gold, silver, platinum, palladium, copper, aluminum, carbon, cobalt sulfide, copper sulfide, nickel oxide, and a composite thereof. As a non-limiting example, when the first electrode is a transparent electrode, the first electrode may be an inorganic-based conductive electrode such as a fluorine doped tin oxide (FTO), an indium doped tin oxide (ITO), ZnO, CNT (carbon nanotube) or graphene, or an organic-based conductive electrode such as PEDOT:PSS. When it is intended to provide a transparent solar cell, it is preferred that the electrode (first electrode and second electrode) and the substrate are a transparent electrode and a transparent substrate. In addition, when the electrode (first electrode and second electrode) is the organic-based conductive electrode, it is more preferred for providing a flexible solar cell or a transparent solar cell.

The first charge carrier disposed in the upper portion of the first electrode may serve to prevent direct contact between the first electrode and the light absorber, and to provide a transfer path through which the charges of photoelectrons or light holes produced in the light absorber are transferred. Here, the first charge carrier and the second charge carrier may transfer complementary charges to each other. As an example, when the first charge carrier is an electron carrier, the second charge carrier may be a hole carrier, and when the first charge carrier is a hole carrier, the second charge carrier may be an electron carrier.

Hereinafter, the solar cell according to an exemplary embodiment of the present invention will be described in detail, based on the case that the first charge carrier is the electron carrier, however, when the first charge carrier is the hole carrier, the first charge carrier may have an identical or similar constitution as described above, with respect to the second charge carrier as described below.

The electron carrier may be an electron conducting organic layer or inorganic layer. The electron conductive organic material may be an organic material used as an n-type semiconductor, in a general organic solar cell. As a specific and non-limiting example, the electron conductive organic material may include fullerene (C60, C70, C74, C76, C78, C82 or C95), fullerene-derivatives including PCBM ([6,6]-phenyl-$C_{61}$-butyric acid methyl ester)) and C71-PCBM, C84-PCBM, $PC_{70}BM$ ([6,6]-phenyl C70-butyric acid methyl ester), PBI (polybenzimidazole), PTCBI (3,4,9,10-perylenetetracarboxylic bisbenzimidazole), F4-TCNQ (tetrafluorotetracyanoquinodimethane), or a mixture thereof.

The electron conductive inorganic material may be an electron conductive metal oxide used for electron transfer, in a general quantum dot based solar cell or dye-sensitized solar cell. As a specific example, the electron conductive metal oxide may be an n-type metal oxide semiconductor. A non-limiting example of the n-type metal oxide semiconductor may include one or two or more materials selected from the group consisting of Ti oxide, Zn oxides, In oxides, Sn oxides, W oxides, Nb oxides, Mo oxides, Mg oxides, Ba oxides, Zr oxides, Sr oxides, Yr oxides, La oxides, V oxides, Al oxides, Y oxides, Sc oxides, Sm oxides, Ga oxides, In oxides and SrTi oxides, and also a mixture or composite thereof.

In the structure, the electron carrier may be a porous layer (porous film) or a dense layer (dense film). The dense electron carrier may be a film of the electron conductive organic material, or a dense film of the electron conductive inorganic material as described above.

The porous electron carrier may be a porous film consisting of particles of the electron conductive inorganic material as described above. The electron carrier may have a thickness of 50 nm to 10 μm, specifically 50 nm to 1000 nm. When the electron carrier is porous, it has a specific surface area of 10 to 100 $m^2$/g, and electron conductive inorganic particles forming the electron carrier may have an average diameter of 5 to 500 nm. The porosity (apparent porosity) of the porous electron carrier may be 30% to 65%, specifically 40% to 60%.

In the case that the electron carrier has a porous structure, there may be further provided an electron transport film between the first electrode and the electron carrier. The electron transport film may serve to previously prevent direct contact between the light absorber and the first electrode, and simultaneously with serving to transport electrons. The electron transport film may be any material, as long as electrons are spontaneously transferable from a porous metal oxide to the first electrode, through the electron transport film, in an energy band diagram. As a non-limiting and specific example, the electron transport film may be a metal oxide thin film, and the metal oxide of the metal oxide thin film may be identical to or different from the metal oxide of the porous metal oxide. Specifically, the material of the metal oxide thin film may be one or more materials selected from the group consisting of Ti oxide, Zn oxides, In oxides, Sn oxides, W oxides, Nb oxides, Mo oxides, Mg oxides, Ba oxides, Zr oxides, Sr oxides, Yr oxides, La oxides, V oxides, Al oxides, Y oxides, Sc oxides, Sm oxides, Ga oxides, In oxides, SrTi oxides and ZnSn oxides, and a mixture or composite thereof. The electron transport film may substantially have a thickness of 10 nm or more, more substantially 10 nm to 100 nm, and still more substantially 50 nm to 100 nm.

When the electron carrier is a porous layer (porous film), the first electrode and the electron carrier are formed on the substrate, and then according to the method for preparing the perovskite compound film as described above, preparing the perovskite compound film in the upper portion of the electron carrier, thereby filling pores of the electron carrier, and preparing a light absorber of the perovskite compound in the form of a film covering the upper portion of the electron carrier.

When the electron carrier is a dense layer, the first electrode and the electron carrier are formed on the substrate, and then according to the method for preparing the perovskite compound film as described above, preparing the perovskite compound film in the upper portion the electron carrier, thereby preparing a light absorber in the form of a thin film.

The second charge carrier may be a hole carrier, and the hole carrier may be an organic hole carrier, an inorganic hole carrier, or a laminate thereof.

When the hole carrier includes the inorganic hole carrier, the inorganic hole carrier may be an oxide semiconductor, a sulfide semiconductor, a halide semiconductor or a mixture thereof, which has hole conductivity, that is, which is a p-type semiconductor.

An example of the oxide semiconductor may include NiO, CuO, $CuAlO_2$, $CuGaO_2$ and the like, an example of the sulfide semiconductor may include PbS, and an example of the halide semiconductor may include $PbI_2$ and the like, but the present invention is not limited to the inorganic hole carrier materials.

The hole carrier may be a dense layer (dense film). The dense hole carrier may be a dense film of the p-type semiconductor as described above. The inorganic electron carrier may have a thickness of 50 nm to 10 μm, specifically 10 nm to 1000 nm, and more specifically 50 nm to 1000 nm.

When the hole carrier includes the organic hole carrier, the organic hole carrier may include an organic hole transporting material, specifically a unimolecular or high molecular organic hole transporting material (hole transporting organic material). The organic hole transporting material may be any material as long as the material is an organic hole transporting material used in a general inorganic semiconductor-based solar cell using an inorganic semiconductor quantum dot as dye, and a high molecular organic hole transporting material is preferred in terms of stability.

A non-limiting example of a unimolecular to low molecular organic hole transporting material may include one or two or more materials selected from the group consisting of pentacene, coumarin 6, 3-(2-benzothiazolyl)-7-(diethylamino)coumarin), ZnPC (zinc phthalocyanine), CuPC (copper phthalocyanine), TiOPC (titanium oxide phthalocyanine), Spiro-MeOTAD (2,2',7,7'-tetrakis(N,N-p-dimethoxyphenylamino)-9,9'-spirobifluorene), F16CuPC (copper(II) 1,2,3,4,8,9,10,11,15,16,17,18,22,23,24,25-hexadecafluoro-29H,31H-phthalocyanine), SubPc (boron subphthalocyanine chloride) and N3 (cis-di(thiocyanato)-bis(2,2'-bipyridyl-4,4'-dicarboxylic acid)-ruthenium(II)), but not limited thereto.

It is preferred that the organic hole transporting material is a polymer (hole conductive polymer) in terms of stability, and the hole conductive polymer may be one or two or more materials selected from the group consisting of thiophen-based, paraphenylenevinylene-based, carbazol-based, and triphenylamine-based polymers, and considering energy matching, one or two or more selected from the group consisting of thiophene-based and triphenylamine-based polymers are preferred, and a triphenylamine-based polymer is more preferred. A non-limiting example of the high molecular organic hole transporting material may include one or two or more materials selected from the group consisting of P3HT (poly[3-hexylthiophene]), MDMO-PPV (poly[2-methoxy-5-(3',7'-dimethyloctyloxyl)]-1,4-phenylene vinylene), MEH-PPV (poly[2-methoxy-5-(2'''-ethyl-hexyloxy)-p-phenylene vinylene]), P3OT (poly(3-octyl thiophene)), POT (poly(octyl thiophene)), P3DT (poly(3-decyl thiophene)), P3DDT (poly(3-dodecyl thiophene), PPV (poly(p-phenylene vinylene)), TFB (poly(9,9'-dioctylfluorene-co-N-(4-butylphenyl)diphenyl amine), Polyaniline, Spiro-MeOTAD ([2,22',7,77'-tetrakis (N,N-di-p-methoxyphenyl amine)-9,9,9'-spirobifluorine]), PCPDTBT (Poly[2,1,3-benzothiadiazole-4,7-diyl[4,4-bis(2-ethylhexyl-4H-cyclopenta [2,1-b:3,4-b']dithiophene-2,6-diyl]], Si-PCPDTBT (poly[(4,4'-bis(2-ethylhexyl)dithieno[3,2-b:2',3'-d]silole)-2, 6-diyl-alt-(2,1,3-benzothiadiazole)-4,7-diyl]), PBDTTPD (poly((4,8-diethylhexyloxyl) benzo([1,2-b:4,5-b']dithiophene)-2,6-diyl)-alt-((5-octylthieno[3,4-c]pyrrole-4,6-dione)-1,3-diyl)), PFDTBT (poly[2,7-(9-(2-ethylhexyl)-9-hexyl-fluorene)-alt-5,5-(4',7, -di-2-thienyl-2',1', 3'-benzothiadiazole)]), PFO-DB T (poly[2,7-.9,9-(dioctylfluorene)-alt-5,5-(4',7'-di-2-.thienyl-2', 1',3'-benzothiadiazole)]), PSiFDTBT (poly[(2,7-dioctylsilafluorene)-2,7-diyl-alt-(4,7-bis(2-thienyl)-2,1,3-benzothiadiazole)-5,5'-diyl]), PSBTBT (poly[(4,4'-bis(2-ethylhexyl)dithieno[3,2-b:2',3'-d]silole)-2,6-diyl-alt-(2,1,3-benzothiadiazole)-4,7-diyl]), PCDTBT (Poly [[9-(1-octylnonyl)-9H-carbazole-2,7-diyl]-2,5-thiophenediyl-2,1,3-benzothiadiazole-4,7-diyl-2,5-thiophenediyl]), PFB (poly(9,9'-dioctylfluorene-co-bis(N,N'-(4,butylphenyl))bis(N,N'-phenyl-1,4-phenylene)diamine), F8BT (poly(9,9'-dioctylfluorene-co-benzothiadiazole), PEDOT (poly(3,4-ethylenedioxythiophene)), PEDOT:PSS (poly(3,4-ethylenedioxythiophene) poly(styrenesulfonate)), PTAA (poly(triarylamine)), poly(4-butylphenyl-diphenyl-amine), and copolymers thereof. As a non-limiting and specific example, the hole carrier may be a thin film of the organic hole transporting material, and the thickness of the thin film may be 10 nm to 500 nm.

It is natural that the organic hole carrier may further include an additive which is generally used for property improvement such as conductivity improvement of an organic-based hole conducting layer in an inorganic semiconductor-based solar cell using a general inorganic semiconductor quantum dot as dye. As a non-limiting example, the hole carrier may further contain one or two or more additives selected from the group consisting of TBP (tertiary butyl pyridine), LiTFSI (lithium bis(trifluoro methanesulfonyl)imide) and tris(2-(1H-pyrazol-1-yl)pyridine)cobalt(III), and may contain 0.05 mg to 100 mg of the additive per 1 g of the organic hole transporting material. However, the present invention is not limited by the presence/absence of the additive, the kind of the additive, and the content of the additive in the hole carrier, of course.

The second electrode is any conductive electrode which is ohmic-joined to the hole carrier, and any material commonly used for an electrode material of a front electrode or a back electrode in a solar cell may be used. As a non-limiting example, when the second electrode is the electrode material of a back electrode, the second electrode may be one or more materials selected from the group consisting of gold, silver, platinum, palladium, copper, aluminum, carbon, cobalt sulfide, copper sulfide, nickel oxide, and a composite thereof. As a non-limiting example, when the second electrode is a transparent electrode, the second electrode may be an inorganic-based conductive electrode such as a fluorine doped tin oxide (FTO), an indium doped tin oxide (ITO), ZnO, CNT (carbon nanotube) or graphene, or an organic-based conductive electrode such as PEDOT:PSS. In the case of providing a transparent solar cell, it is preferred that the second electrode is a transparent electrode, and in the case that the second electrode is the organic-based conductive electrode, it is more preferred for providing a flexible solar cell or a transparent solar cell.

Preparation Example 1

Preparation of substrate having porous electron transport layer and transparent electrode formed thereon A glass substrate on which a fluorine doped tin oxide was coated (FTO; F-doped $SnO_2$, 8 ohms/$cm^2$, Pilkington, hereinafter, referred to as FTO substrate (first electrode)) was cut into a size of 25×25 mm, and then an end portion thereof was etched, thereby partially removing FTO.

On the cut and partially etched FTO substrate, a $TiO_2$ dense film having a thickness of 50 nm was prepared by spray pyrolysis, as a metal oxide thin film. The spray pyrolysis was carried out using a TAA (titanium acetylacetonate):EtOH (1:9 v/v %) solution, and the thickness was adjusted in a manner of repeating the process of spraying the solution for 3 seconds, and stopping for 10 seconds, on the FTO substrate placed on a hot plate maintained at 450° C.

An ethyl cellulose solution in which 10 wt % of ethyl cellulose was dissolved in ethyl alcohol was added to $TiO_2$ powder (prepared by hydrothermal treatment of an aqueous titanium peroxocomplex solution in which 1 wt % is dissolved based on $TiO_2$ at 250° C. for 12 hours) having an average particle size (diameter) of 50 nm, at 5 ml per 1 g of $TiO_2$ powder, terpineol was added thereto and mixed at 5 g per 1 g of $TiO_2$ powder, and ethyl alcohol was removed therefrom by distillation under reduced pressure, thereby preparing $TiO_2$ paste.

Ethanol was added to the prepared $TiO_2$ powder paste (weight ratio of 1 ($TiO_2$ powder paste):5 (ethanol)) to prepare $TiO_2$ slurry for spin coating. On a $TiO_2$ thin film of the FTO substrate, $TiO_2$ slurry for spin coating was coated (3000 rpm) by a spin coating method, heat treatment was performed at 500° C. for 60 minutes, then the heat-treated substrate was immersed in a 30 mM $TiCl_4$ aqueous solution at 60° C., stood for 30 minutes, and washed with deionized water and ethanol, dried, and heat-treated again at 500° C. for 30 minutes, thereby preparing a porous $TiO_2$ thin film (porous electron carrier). Here, the porous $TiO_2$ thin film (porous electron carrier) had a thickness of 100 nm, and the prepared porous electron carrier had a specific surface area of 33 $m^2$/g and porosity (apparent porosity) of 50%.

Example 1

Preparation of Perovskite Compound Solution

Methylammonium iodide ($CH_3NH_3I$, methylammonium indicated as MA), formamidinium iodide ($CH(NH_2)_2I$, formamidinium indicated as FA), methylammonium bromide ($CH_3NH_3Br$, MABr), formamidinium bromide ($CH(NH_2)_2Br$, FABr), $PbI_2$ and $PbBr_2$ were mixed with and dissolved in a mixed solution of dimethylformamide (DMF) and dimethyl sulfoxide (DMSO) (4:1 vol/vol), so that the composition of $(FAPbI_3)_{0.85}(MAPbBr_3)_{0.15}$ is satisfied, and methylammonium chloride was added as an additive so as to be a mole ratio of 0.1 mol, 0.25 mol, 0.5 mol, 0.75 mol or 1 mol based on 1 mol of $(FAPbI_3)_{0.85}(MAPbBr_3)_{0.15}$ $(=(FA_{0.85}MA_{0.15})Pb(I_{0.85}Br0.15)_3)$, thereby preparing a perovskite compound solution.

On the porous electron carrier prepared in the preparation example, the thus-prepared perovskite compound solution was coated on (injected to) a rotation center batchwise, and a spin speed was 5000 rpm after 1500 rpm for 60 seconds, thereby conducting spin coating. At the point of 50 seconds after starting spin coating, 1 ml toluene as a non-solvent was coated on (injected to) a rotation center of a porous electron carrier being rotated again batchwise, and then spin coating was further conducted for further 60 seconds. After spin coating was performed, annealing was performed under the condition of a temperature of 150° C. and normal pressure for 10 minutes, thereby preparing a perovskite compound film. Here, it was confirmed that the perovskite compound was prepared in the form of a dense film (thickness of about 250 nm) which fills pores of the porous electron carrier and covers the porous electron carrier. During the preparation of the perovskite compound film, the surrounding was maintained at a temperature of 25° C. and a relative humidity of 25%.

GIWAXS analysis was performed under the condition of an incidence angle of 0.3° using X-ray at λ=1.0688 Å (11.6 keV) having a beam size of 150 μm (h)×120 μm (v) (FWHM: full width at half maximum), and measurement was performed using a bending magnet light source 6D UNIST-PAL beam line manufactured by Pohang Accelerator Laboratory. A scattering image was collected using a two-dimensional area detector (manufactured by Rayonix, Model No.: MX225-HS), and the detector was disposed at 246.4118 mm from the sample. A measured area of the sample was 0.15 mm×1 mm (a vertical length of a beaming direction×a beam direction length).

FIG. 1 is a drawing illustrating a GIWAXS spectrum depending on the content of the additive of the perovskite compound film prepared in Example 1. In the drawing, as the color is close to white, a higher diffraction intensity is detected, and as the color is close to black, a lower diffraction intensity is detected. In FIG. 1, 1:0 means the result of the perovskite compound film prepared in the same manner as in Example 1 without adding the additive, and FTO/TiO$_2$ ref is a drawing illustrating a GIWAXS spectrum of the substrate having a porous electron carrier formed thereon, before the perovskite compound film is formed. 1:0.1, 1:0.25, 1:0.5, 1:0.75 and 1:1 illustrated in the drawing in FIG. 1 mean the results of the samples to which 0.1 mol, 0.25 mol, 0.5 mol, 0.75 mol or 1 mol of the additive was added based on 1 mol of the perovskite compound. In the GIWAXS spectrum of FIG. 1, q=0.99 corresponds to a perovskite compound (100) crystal plane diffraction pattern, and q=1.97 corresponds to a (200) crystal plane diffraction pattern.

In FIG. 1, as seen from the sample result of 1:0, when a solution in which only the perovskite compound is purely dissolved was coated, an arc-type diffraction pattern appeared due to a random orientation, but a preferred orientation at $q_{xy}=0$ (azimuth=90°) did not appear, and it was found that strong diffraction occurred in some specific directions at azimuths of 25°, 50°, 125°, 155° and the like.

However, in the case of the sample of 1:0.25 to 1:0.25 in FIG. 1, it was found that the arc-type diffraction pattern having a very uniform intensity at q=0.99 occurred, and when the ratio of the perovskite compound:the additive is 1:0.75 or more, a spot-type discontinuous diffraction pattern occurred.

That is, it was found that when the additive was not added, the perovskite compound film having both of the random orientation and the preferred orientation was prepared, but the orientation in which the (100) plane is positioned in parallel to the film (substrate) which is the preferred orientation did not appear, and when the ratio of the perovskite compound:the additive is 1:0.2, the perovskite compound film having an extremely random orientation in which the preferred orientation which appears when the additive is not added disappeared completely and a specific orientation did not appear was prepared. In addition, it was found that when the ratio of the perovskite compound: the additive was 0.5, a new preferred orientation, that is, an orientation in which the (100) plane is positioned in parallel to a film (substrate) surface appeared together with a random orientation.

In addition, it was found that as the content of the additive was increased to 1:0.75 or more, a high degree of orientation in which the (100) plane is positioned only in specific directions from random directions was shown, and a discontinuous spot-type pattern appeared.

In addition, in Example 1, as a result of injecting toluene, and then observing changes in GIWAXS spectrum over an annealing time, it was confirmed that the orientation as in FIG. 1 was shown at the time of injecting toluene.

Figure 2:
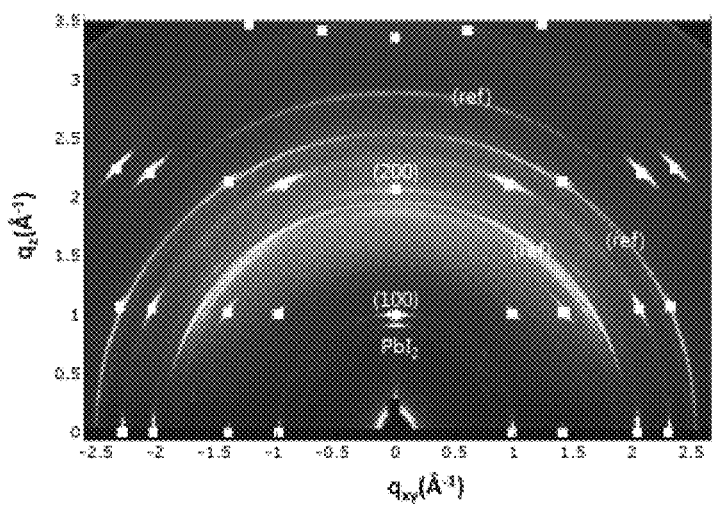
FIG. 2 is a drawing illustrating a GIWAXS spectrum of a 1:1 sample, in FIG. 1.

FIG. 2 is a drawing illustrating a GIWAXS spectrum of the 1:1 sample (in which a white square is an index point), and as seen from FIG. 2, it was found that a very strong diffraction spot was shown at qxy=0. It was found therefrom that most of grains forming the perovskite compound film were oriented so that the (100) crystal plane is in parallel to the film (or a substrate surface since the film surface and the glass substrate are in parallel).

Figure 3:
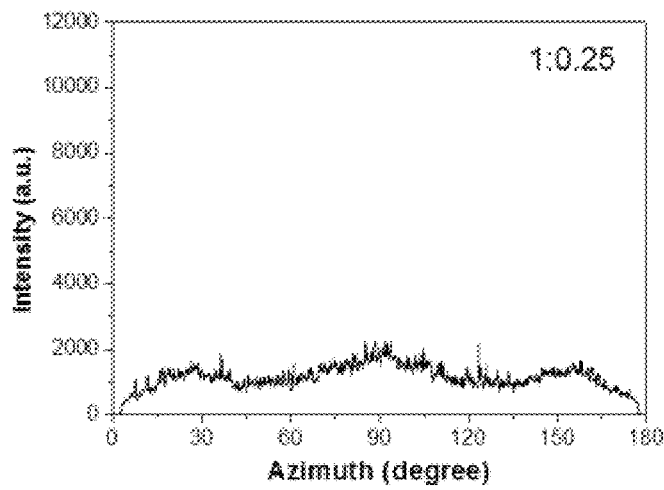
FIG. 3 is a drawing illustrating the (100) plane diffraction intensity of a 1:0.25 sample, depending on an azimuth, in FIG. 1.
Figure 4:
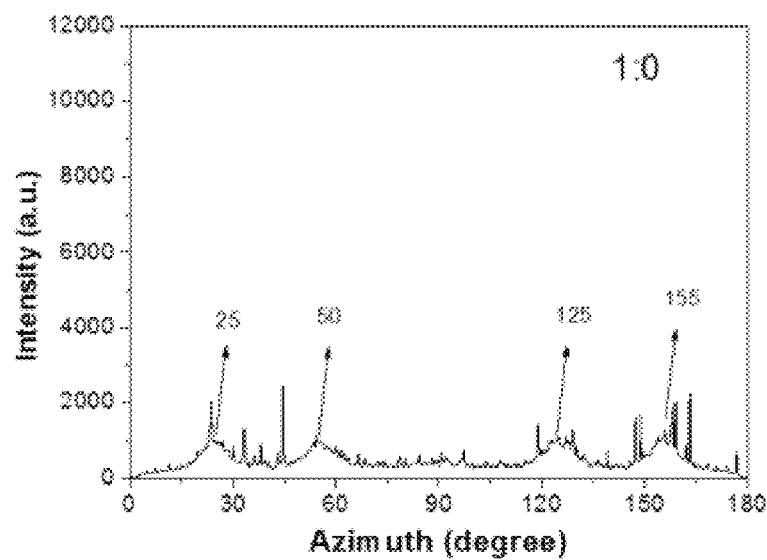
FIG. 4 is a drawing illustrating the (100) plane diffraction intensity of a 1:0 sample, depending on an azimuth, in FIG. 1.

FIG. 3 illustrates the (100) plane diffraction intensity of the 1:0.25 sample depending on an azimuth in FIG. 3, and FIG. 4 illustrates the (100) plane diffraction intensity of the 1:0 sample depending on an azimuth in FIG. 1.

As seen from FIG. 3, it was found that the 1:0.25 sample had diffraction in all directions and at the same time had almost the same diffraction intensity in all directions. PO(100) which is a value of intensity at an azimuth=90° divided by an average intensity in an azimuth range of 10 to 170° was 1.618, and it was found therefrom that the sample had a very weak orientation in which the (100) plane is in parallel to the film surface. In addition, an average intensity in an azimuth range of 10 to 170° was 1231.162, and the standard deviation of intensity at this time was 295.673, and the uniformity (UF) was 0.240, and thus, it was found that an almost uniform diffraction in all directions occurred.

As seen from FIG. 1, in the case of the sample 1:0.5 also, diffraction in all directions by a random orientation occurred to generate arc-type continuous diffraction. In the case of 1:0.5 sample, an average intensity in an azimuth range of 10 to 170° was 1231.162, an intensity at an azimuth=90° was 1992.099, and PO(100) was 6.888, and thus, it was found that the preferred orientation in which the (100) plane is in parallel to the film surface was very clearly increased.

However, in the case of 1:0 sample, as seen from FIG. 4, it was found that stronger diffraction occurred in specific directions at azimuths of 25°, 50°, 125° and 155° and the like, together with diffraction in all directions, and grains having the preferred orientation were present. However, upon review of the preferred orientation at $q_{xy}=0$ (azimuth=90°) which is the preferable, an average intensity in an azimuth range of 10 to 170° was 539.028, and an intensity at an azimuth=90° was 374.801, and thus, it was found that the preferred orientation did not appear at all. In addition, due to the orientation at 25°, 50°, 125°, 155° and the like, the uniformity (UF) reached 0.527, and thus, it was confirmed that the uniformity was significantly deteriorated as compared with the 1:0.25 sample.

Figure 5:
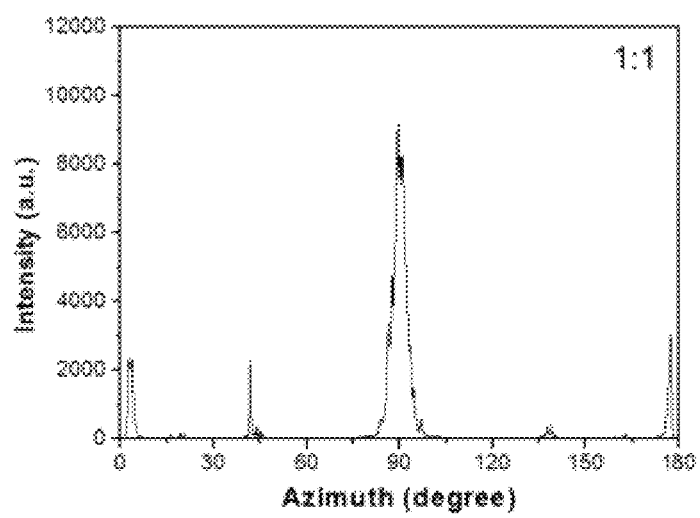
FIG. 5 is a drawing illustrating the (100) plane diffraction intensity of the 1:1 sample, depending on an azimuth, in FIG. 1.

FIG. 5 illustrates the (100) plane diffraction intensity (q=0.99) of the 1:1 sample, depending on an azimuth, in FIG. 1. As seen from FIG. 5, it was found that the sample had a discontinuous peak form, and an extremely strong diffraction peak at an azimuth=90°. As seen from FIG. 5, in the case of the 1:1 sample, the number of peaks having an intensity of 10% or more based on the intensity of a peak positioned at an azimuth of 90° was only four, and it was found therefrom that the (100) crystal plane of many crystals among grains forming the perovskite compound was oriented and present to be parallel to the film, but the (100) crystal plane of a trace amount of crystals was oriented and present in three directions, not in parallel to the film.

An intensity ratio ($I_f/I_s$) obtained by dividing an intensity ($I_f$) of a peak positioned at an azimuth of 90° by an intensity ($I_s$) of the second strongest peak (peak positioned at an azimuth of 170 to 178°) was 2.67, and thus, it was found that the (100) crystal plane of the most of grains forming the perovskite compound was oriented to be parallel to the film. It was confirmed that in the case of the 1:1 sample, a sharp peak was shown in which FWHM of the peak positioned at an azimuth of 90° was 4.1°, and in the case of the 1:0.75 sample also, slight peak broadening was present as compared with the 1:1 sample, in which FWHM of the peak positioned at an azimuth of 90° was 5.2°, but the GIWAXS spectrum was similar to the 1:1 sample.

Figure 6:
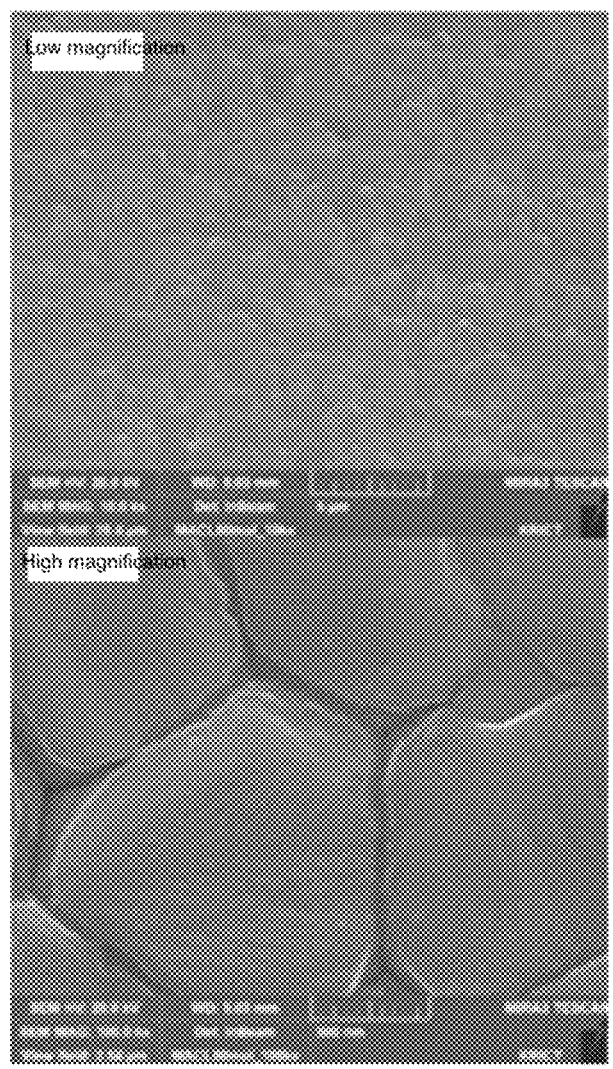
FIG. 6 is a scanning electron microscope photograph observing the surface of the perovskite compound film of a 1:0.5 sample, in FIG. 1.
Figure 7:
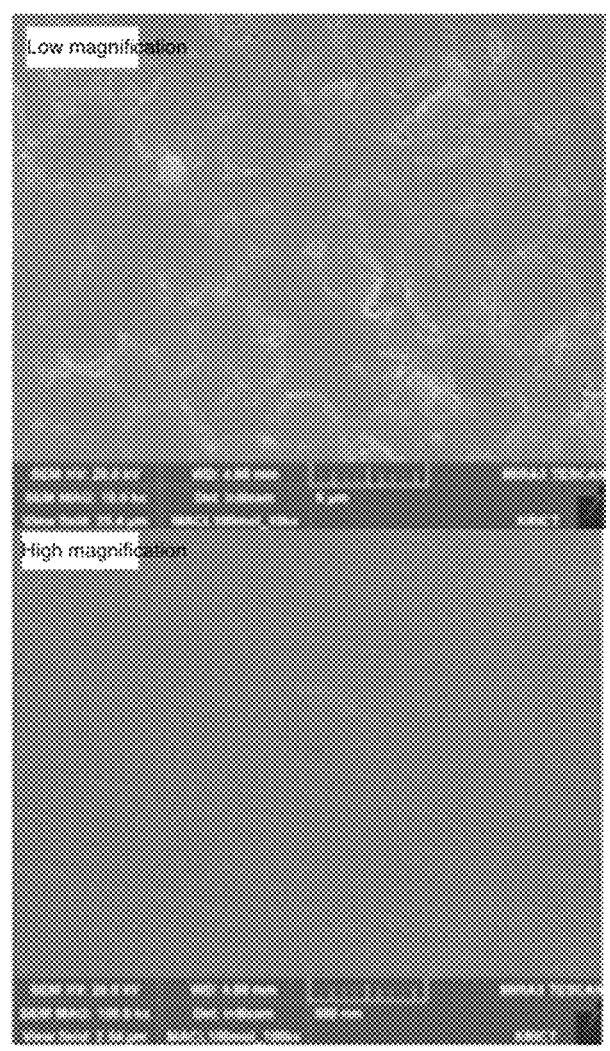
FIG. 7 is a scanning electron microscope photograph observing the surface of the perovskite compound film of the 1:1 sample, in FIG. 1.

FIG. 6 is a scanning electron microscope photograph observing the surface of the perovskite compound film of the 1:0.5 sample, and FIG. 7 is a scanning electron microscope photograph observing the surface of the perovskite compound of the 1:1 sample.

As seen from FIGS. 6 and 7, it was found that by the content of the additive, the orientation of the perovskite compound film was controlled, and significant coarsening of the perovskite compound grains occurred. In particular, in the case of the 1:1 sample, it was found that the average grain size was 3-5 μm, and the perovskite compound film having a high degree of orientation and consisting of extremely coarse grains was prepared.

Figure 8:
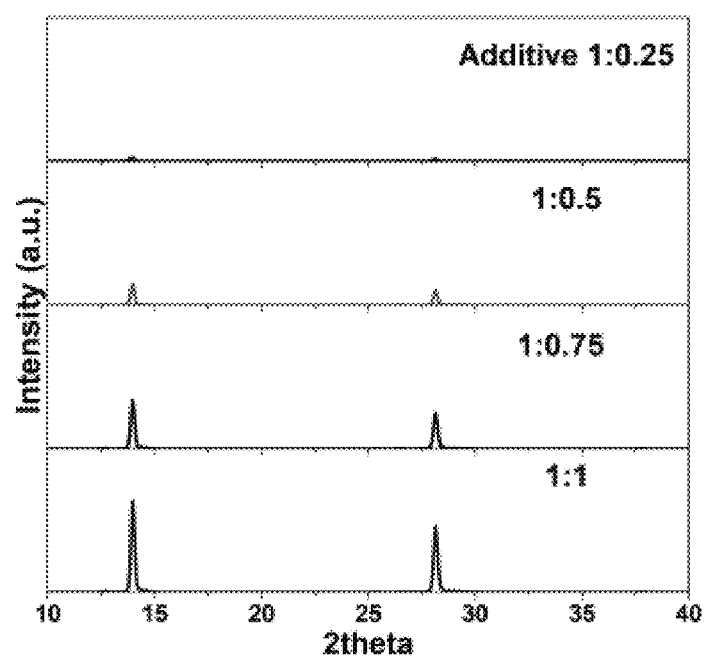
FIG. 8 is a drawing illustrating the X-ray diffraction pattern of the perovskite compound film prepared in Example 1.

FIG. 8 is a drawing illustrating the X-ray diffraction pattern (using Cu-Kα ray) of the perovskite compound film prepared in the Example. 1:0.25, 1:0.5, 1:0.75 and 1:1 illustrated in FIG. 8 mean the X-ray diffraction results of the samples to which 0.25 mol, 0.5 mol, 0.75 mol or 1 mol of the additive was added based on 1 mol of the perovskite compound.

As seen from FIG. 8, it was found that as the content of the additive was increased, the intensity of the peak (2θ=14° and 28°, corresponding to GIWAXS q=0.99 and q=1.97) representing the crystal phase of the perovskite compound was significantly increased, and at the same time, FWHM of the peak became narrower. It was found therefrom that in the case of the 1:0.75 to 1:1 sample, a film representing a very strong orientation was prepared, and also, the perovskite compound film having excellent crystallinity was prepared.

Hereinabove, although the present invention has been described by specific matters, exemplary embodiments, and drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

The invention claimed is:

1. An inorganic/organic hybrid perovskite compound film, being a polycrystal, and having a discontinuous (100) plane scattering intensity, at which (100) plane diffraction does not occur in all directions and a diffraction peak occurs only at a specific azimuth, on a grazing incidence wide angle X-ray scattering (GIWAXS) spectrum using an X-ray wavelength of 1.0688 Å.

2. The inorganic/organic hybrid perovskite compound film of claim 1, wherein 3 to 15 peaks are present in a plane (100) scattering vector (q, Å$^{-1}$).

3. The inorganic/organic hybrid perovskite compound film of claim 2, wherein the scattering spectrum is an intensity distribution in which a scattering vector component $q_z$ is an y axis, and a scattering vector component $q_{xy}$ is an x axis, and among (100) plane peaks, a strongest peak is positioned at $q_{xy}$=0.

4. The inorganic/organic hybrid perovskite compound film of claim 3, wherein the scattering spectrum satisfies the following Equation 1:

$$2.0 \leq I_f/I_s \quad \text{(Equation 1)}$$

wherein $I_f$ is an intensity of a strongest peak among the (100) plane peaks, and $I_s$ is an intensity of a second strongest peak among the (100) plane peaks.

5. An inorganic/organic hybrid perovskite compound film, being a polycrystal, having a continuous scattering intensity in an azimuth range of 10 to 170°, based on a (100) plane scattering intensity depending on the azimuth, in a GIWAXS spectrum using an X-ray wavelength of 1.0688 Å, and having an orientation defined by the following Equation 2 which satisfies the following Equation 3:

$$PO(100)=I_{90}/I_{ave} \quad \text{(Equation 2)}$$

wherein PO(100) is an orientation in which the (100) plane is oriented in parallel to the film, $I_{90}$ is an intensity at an azimuth of 90°, based on the (100) plane scattering intensity depending on the azimuth, and $I_{ave}$ is an average scattering intensity in the azimuth range of 10 to 170°, based on the (100) plane scattering intensity depending on the azimuth, $$1.0 \leq PO(100) \leq 25. \quad \text{(Equation 3)}$$

6. The inorganic/organic hybrid perovskite compound film of claim 5, wherein uniformity defined by the following Equation 4 satisfies the following Equation 5:

$$UF=\sigma/I_{ave} \quad \text{(Equation 4)}$$

wherein UF is uniformity, $I_{ave}$ is an average scattering intensity in the azimuth range of 10 to 170°, based on the (100) plane scattering intensity depending on the azimuth, and σ is a scattering intensity standard deviation in the azimuth range of 10 to 170°, $$0.1 \leq UF \leq 0.4. \quad \text{(Equation 5)}$$

7. The inorganic/organic hybrid perovskite compound film of claim 1, wherein the inorganic/organic hybrid perovskite compound of the inorganic/organic hybrid perovskite compound film satisfies the following Chemical Formula 1, 2 or 3:

$$AMX_3 \quad \text{(Chemical Formula 1)}$$

wherein A is monovalent cation, which is an organic ammonium ion, an amidinium group ion, or an organic ammonium ion and an amidinium group ion, M is a divalent metal ion, and X is a halogen ion, $$A(M_{1-a}N_a)X_3 \quad \text{(Chemical Formula 2)}$$

wherein A is a monovalent cation, which is an organic ammonium ion, an amidinium group ion, or an organic ammonium ion and an amidinium group ion, M is a divalent metal ion, N is one or more doping metal ions selected from the group consisting of a monovalent metal ion and a trivalent metal ion, a is a real number of $0<a\leq0.1$, and X is a halogen ion, $$A(N^1_{1-b}N^2_b)X_3 \quad \text{(Chemical Formula 3)}$$

wherein A is a monovalent cation, which is an organic ammonium ion, an amidinium group ion, or an organic ammonium ion and an amidinium group ion, $N^1$ is a monovalent metal ion, $N^2$ is a trivalent metal ion, b is a real number of $0.4\leq b\leq 0.6$, and X is a halogen ion.

8. A method for preparing the inorganic/organic hybrid perovskite compound film of claim 1, comprising:
   coating a perovskite compound solution containing an inorganic/organic hybrid perovskite compound and an additive which is an organic halide on a substrate, and
   bringing the perovskite compound solution coated on the substrate into contact with a non-solvent of a perovskite compound and performing annealing,
   wherein a content of the additive in the perovskite compound solution is adjusted to control a crystal orientation of the inorganic/organic hybrid perovskite compound film, and
   the perovskite compound solution contains 0.75 to 1.5 mol of the additive, based on 1 mol of the inorganic/organic hybrid perovskite compound.

9. The method for preparing an inorganic/organic hybrid perovskite compound film of claim 8, wherein the additive is methylammonium halide.

10. The method for preparing an inorganic/organic hybrid perovskite compound film of claim 8, wherein the coating of a perovskite compound solution and the contact with a non-solvent are performed by sequential coating of the perovskite solution and the non-solvent using spin coating.

11. A device comprising the inorganic/organic hybrid perovskite compound film of claim 1.

12. The device of claim 11, wherein the device is selected from the group consisting of an electronic device, a light emitting device, a memory device, a photovoltaic device, an optical sensor or a thermoelectric device.

13. A method for preparing the inorganic/organic hybrid perovskite compound film of claim 5, comprising:
   coating a perovskite compound solution containing an inorganic/organic hybrid perovskite compound and an additive which is an organic halide on a substrate, and
   bringing the perovskite compound solution coated on the substrate into contact with a non-solvent of a perovskite compound and performing annealing,
   wherein a content of the additive in the perovskite compound solution is adjusted to control a crystal orientation of the inorganic/organic hybrid perovskite compound film, and
   the perovskite compound solution contains 0.2 to 0.7 mol of the additive, based on 1 mol of the inorganic/organic hybrid perovskite compound.

* * * * *